(12) United States Patent  
Asano et al.

(10) Patent No.: US 7,262,470 B2  
(45) Date of Patent: Aug. 28, 2007

(54) SEMICONDUCTOR DEVICE

(75) Inventors: Tetsuro Asano, Oizumi-machi (JP); Mikito Sakakibara, Kumagaya (JP); Toshikazu Hiraj, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 145 days.

(21) Appl. No.: 10/772,585

(22) Filed: Feb. 6, 2004

(65) Prior Publication Data

US 2004/0222469 A1 Nov. 11, 2004

(30) Foreign Application Priority Data

Feb. 6, 2003 (JP) ............... 2003-029858  
Dec. 25, 2003 (JP) ............... 2003-429799

(51) Int. Cl.  
*H01L 21/00* (2006.01)

(52) U.S. Cl. ............ 257/363; 257/355; 257/275

(58) Field of Classification Search ............ 257/363, 257/355, 275  
See application file for complete search history.

(56) References Cited

U.S. PATENT DOCUMENTS

| | | | |
|---|---|---|---|
| 4,339,285 A | 7/1982 | Pankove | |
| 4,387,386 A | 6/1983 | Garver | |
| 4,626,802 A | 12/1986 | Gailus | |
| 4,745,445 A | 5/1988 | Mun et al. | |
| 4,803,527 A | 2/1989 | Hatta et al. | |
| 4,843,440 A | 6/1989 | Huang | |
| 4,965,863 A | 10/1990 | Cray | |
| 5,047,355 A | 9/1991 | Huber et al. | |
| 5,371,405 A | 12/1994 | Kagawa | |
| 5,374,899 A | 12/1994 | Griffiths et al. | |
| 5,559,363 A | 9/1996 | Immorlica, Jr. | |
| 5,654,860 A | 8/1997 | Casper et al. | |
| 5,684,323 A * | 11/1997 | Tohyama | ............ 257/363 |

(Continued)

FOREIGN PATENT DOCUMENTS

DE 3334167 4/1985

(Continued)

OTHER PUBLICATIONS

Miyawaki, Yasuo et al. (1986) "Ion-Implanted Low Noise Dual-Gate GaAs MESFET," Sanyo Technical Review 18(2), pp. 76-84.

(Continued)

*Primary Examiner*—Laura M. Schillinger  
(74) *Attorney, Agent, or Firm*—Morrison & Foerster LLP

(57) ABSTRACT

With a microwave FET, the internalized Schottky junction capacitance or pn junction capacitance is small and these junctions are weak against static electricity. However, with a microwave device, a protecting diode could not be connected since the increase of parasitic capacitance resulting from this method causes degradation of the high frequency characteristics. Therefore, to eliminate this problem, a semiconductor device is provided, wherein two paths, extending from a gate electrode pad to a gate electrode on an operating region, are arranged, with one path running near a source electrode pad, the other path running near a drain electrode pad, and at the respective parts where a path becomes close to a pad, the abovementioned protecting elements are connected between the gate electrode and source electrode and between the gate electrode and drain electrode to improve the electrostatic breakdown voltage of the FET from approximately 100V to 700V.

8 Claims, 22 Drawing Sheets

U.S. PATENT DOCUMENTS

| | | | |
|---|---|---|---|
| 5,821,827 A | 10/1998 | Mohwinkel et al. | |
| 5,841,184 A | 11/1998 | Li | |
| 5,932,917 A | 8/1999 | Miura et al. | |
| 5,986,863 A | 11/1999 | Oh | |
| 6,002,860 A | 12/1999 | Voinigescu et al. | |
| 6,265,756 B1 | 7/2001 | Brocket et al. | |
| 6,580,107 B2 | 6/2003 | Higashino et al. | |
| 6,914,280 B2 * | 7/2005 | Asano et al. | 257/275 |
| 6,946,891 B2 * | 9/2005 | Asano et al. | 327/318 |
| 7,193,255 B2 * | 3/2007 | Asano | 257/275 |
| 2002/0024375 A1 | 2/2002 | Asano et al. | |
| 2002/0047177 A1 | 4/2002 | Asano et al. | |
| 2004/0130380 A1 * | 7/2004 | Asano et al. | 327/427 |
| 2004/0222469 A1 * | 11/2004 | Asano et al. | 257/355 |
| 2004/0223274 A1 * | 11/2004 | Asano et al. | 361/56 |
| 2005/0121730 A1 * | 6/2005 | Asano et al. | 257/376 |
| 2005/0263796 A1 * | 12/2005 | Asano | 257/239 |
| 2005/0274979 A1 * | 12/2005 | Asano | 257/192 |
| 2005/0277255 A1 * | 12/2005 | Asano | 438/285 |
| 2005/0285143 A1 * | 12/2005 | Asano | 257/192 |
| 2006/0151816 A1 * | 7/2006 | Asano et al. | 257/275 |
| 2006/0163609 A1 * | 7/2006 | Asano et al. | 257/192 |
| 2006/0163659 A1 * | 7/2006 | Asano et al. | 257/357 |
| 2006/0164150 A1 * | 7/2006 | Asano | 327/432 |
| 2006/0252651 A1 * | 11/2006 | Asano et al. | 505/193 |
| 2006/0255403 A1 * | 11/2006 | Asano et al. | 257/335 |
| 2006/0289963 A1 * | 12/2006 | Asano et al. | 257/506 |

FOREIGN PATENT DOCUMENTS

| | | |
|---|---|---|
| EP | 0 140 095 | 5/1985 |
| EP | 0 700 161 | 3/1996 |
| JP | 60-86874 | 5/1985 |
| JP | 62-174975 | 7/1987 |
| JP | 2723936 | 12/1988 |
| JP | 2-162744 | 6/1990 |
| JP | 8-236549 | 3/1995 |
| JP | 11-220093 | 8/1999 |
| KR | 1998-043416 | 9/1998 |
| KR | 1998-065222 | 10/1998 |
| WO | WO-97/45877 | 4/1997 |

OTHER PUBLICATIONS

Sze, S.M. (1981). *Physics of Semiconductor Devices*. New York, NY: John Wiley & Sons. pp. 117-122.

* cited by examiner

FIG.8

Electrostatic withstand voltage across respective terminals (unit: V)

| | |
|---|---|
| IN — Ctl-1 | 700 |
| IN — Ctl-2 | 700 |
| OUT1 — Ctl-1 | 700 |
| OUT2 — Ctl-2 | 700 |

Comparison of spreading of currents and recombination

| | a-structure | | | b-structure-1 | | | b-structure-2 | | |
|---|---|---|---|---|---|---|---|---|---|
| Electron current density | y__2 | x__0 | Product | y__2 | x__0 | Product | y__2 | x__0 | Product |
| | 21.9 | 10.5 | 230.0 | 26 | 15 | 390.0 | 23.8 | 11.3 | 268.9 |
| Hole current density | y__2 | x__0 | | y__2 | x__0 | | y__2 | x__0 | |
| | 13.7 | 6 | 82.2 | 23.9 | 12.5 | 298.8 | 12.7 | 7.4 | 94.0 |
| Recombination density | y__2 | x__0 | | y__2 | x__0 | | y__2 | x__0 | |
| | 29.7 | 14.8 | 439.6 | 33.1 | 20 | 662.0 | 33.9 | 15.5 | 525.5 |

| b-structure-3 | | |
|---|---|---|
| y__2 | x__0 | Product |
| 69 | 36.1 | 2490.9 |
| y__2 | x__0 | |
| 47.9 | 29.1 | 1393.9 |
| y__2 | x__0 | |
| 80 or more | 43.9 | 3512 or more |

Relationship between and the electrostatic discharge voltage

Electrostatic withstand voltage across respective terminals (unit: V)

| IN — Ctl-1 | 140 |
|---|---|
| IN — Ctl-2 | 140 |
| OUT1 — Ctl-1 | 500 |
| OUT2 — Ctl-2 | 450 | ent of a compound semiconductor
SEMICONDUCTOR DEVICE

BACKGROUND OF THE INVENTION

1. Field of the Invention

This invention relates to a semiconductor device and particularly relates to a semiconductor device which having an improved electrostatic breakdown voltage.

2. Description of the Related Art

FIG. 23 is a circuit diagram of a compound semiconductor switching circuit device. The source electrodes (or drain electrodes) of first and second FET's, FET1 and FET2, are connected to a common input terminal IN, the gate electrodes of FET1 and FET2 are respectively connected to first and second control terminals Ctl-1 and Ctl-2 via resistors R1 and R2, and the drain electrodes (or source electrodes) of FET1 and FET2 are connected respectively to first and second output terminals OUT1 and OUT2. The control signals applied to first and second control terminals Ctl-1 and Ctl-2 are complementary signals and the FET to which the H level signal is applied turns ON and transmit the input signal applied to common input terminal IN to one of the output terminals. Resistors R1 and R2 have the resistance of 10 KΩ respectively and are provided for preventing high-frequency signals from leaking via the gate electrodes to the DC potential of control terminals Ctl-1 and Ctl-2 which are AC grounded.

FIG. 24 shows an example of a compound semiconductor chip having this compound semiconductor switching circuit integrated.

FET1 and FET2, which perform switching, are disposed at central parts of a GaAs substrate and the resistors R1 and R2 are connected to the respective the gate electrodes of the FET's. Also, pads, respectively corresponding to the common input terminal IN, the output terminals OUT1 and OUT2, and the control terminals Ctl-1 and Ctl-2, are disposed at peripheral parts of the substrate. A gate metal layer (Ti/Pt/Au) 20, which is formed at the same time as the forming of the gate electrodes of the respective FET's, includes a second-layer wiring, indicated by dotted lines, and a pad metal layer (Ti/Pt/Au) 30, which connects the respective elements and form the pads, includes a third-layer wiring, indicated by solid lines. An ohmic metal layer (AuGe/Ni/Au), which is in ohmic contact with the first-layer substrate, forms the source electrodes and drain electrodes of the respective FET's and forms electrodes at the ends of the respective resistors, and this layer is not illustrated in FIG. 11 as it overlaps with the pad metal layer FET1, shown in FIG. 24, are formed on an operating region 12, which is surrounded by alternate long and short dash lines. The three-teeth-comb-shaped third-layer pad metal layer 30 parts, which extend from the lower side, form a source electrode 13 (or drain electrode) connected to the output terminal OUT1, and below this is disposed a source electrode 14 (or drain electrode) formed by the first-layer ohmic metal layer. Also, the three-teeth-comb-shaped third-layer pad metal layer 30 parts, which extend from the upper side, form a drain electrode 15 (or source electrode) connected to the common input terminal IN, and below this is disposed a drain electrode 14 (or source electrode), formed by the first-layer ohmic metal layer. These electrodes are disposed in the form of engaged comb teeth and in between these, a gate electrode 17, formed from second-layer the gate metal layer 20, is disposed on the operating region 12 in the form of five comb teeth. The drain electrode 15 (or source electrode) that has the central comb tooth extending from the upper side is used in common by FET1 and FET2 to contribute to size reduction. Here, the gate width, which is the total gate width of the comb-shaped gate electrode 17 of each FET, is 600 μm.

FIG. 25 shows the results of measuring the electrostatic breakdown voltage of the switching circuit device shown in FIG. 24. Here, the electrostatic breakdown voltage is measured under the following conditions. That is, after applying a test voltage to the terminals of a test capacitor of 220 pF and thereby charging electricity in the test capacitor, the wiring for voltage application is cut off. Thereafter, the charged electricity in the test capacitor is discharged between the terminals of a tested element (FET) without resistance element or inductance element inserted. Thereafter it is determined whether the FET has broken down. If the FET does not break down, the test is repeatedly carried out with the application voltage being increased by 10V at a time, and the first application voltage at which the FET breaks down is measured as the electrostatic breakdown voltage.

As shown in FIG. 25, since there has been no attempt in the art to improve the electrostatic breakdown voltage, the electrostatic breakdown voltage is poor and only 140V between the common input terminal IN and the control terminal Ctl-1 and between the common input terminal IN and the control terminal Ctl-2.

Also, there is a variation of the electrostatic breakdown voltage depending on the terminals which the electrostatic breakdown voltage is measured between. Though the specific mechanism that determines this electrostatic breakdown voltage is unclear, with a switching circuit device, the minimum electrostatic breakdown voltage between two terminals is generally of the level of 100V or less as mentioned above, and the finest care is required for handling. That is, the minimum electrostatic breakdown voltage among the terminals of a device determines the electrostatic breakdown voltage of the device as a whole, and thus improvement of the minimum electrostatic breakdown voltage among these terminals is required.

Besides, unlike other devices for audio, video, and power supply applications, microwave communication devices are low in the internal Schottky junction or pn junction capacitance, and these junctions are weak against static electricity.

Generally in order to protect a device against static electricity, an electrostatic breakdown protecting diode may be connected in parallel between the terminals of a pn junction or Schottky junction, which is damaged readily by electrostatic discharge. However, this approach could not be applied to a microwave device since increased parasitic capacitance due to connection of a protecting diode causes degradation of the high-frequency characteristics.

SUMMARY OF THE INVENTION

The invention provides a semiconductor device that includes a substrate, a plurality of electrodes provided for an operating region formed in the substrate, a plurality of electrode pads formed on the substrate and each connected to a corresponding electrode of the operating region, a plurality of wiring connections between one of the electrodes and a corresponding electrode pad, and a protecting element formed along each of the wiring connections and having a first high concentration impurity region, a second high concentration impurity region and an insulating region between the first and second high concentration impurity regions. The protecting element is disposed between two electric paths each connected to one of the electrodes.

The invention also provides a semiconductor device that includes a substrate, and a gate electrode, a source electrode and a drain electrode. Each of the electrodes is provided for an operating region formed in the substrate. The device also includes an electrode pad provided for each of the electrode and formed on the substrate, a plurality of wiring connections between one of the electrodes and a corresponding electrode pad, and a protecting element formed along each of the wiring connections and having a first high concentration impurity region, a second high concentration impurity region and an insulating region between the first and second high concentration impurity regions. The protecting element is disposed between two electric paths each connected to one of the electrodes.

The invention further provides a semiconductor switching device that includes a first field effect transistor and a second filed effect transistor each formed on a substrate. Each of the transistors includes a source electrode, a gate electrode and a drain electrode. The device also includes a common input terminal connected to the source electrodes or the drain electrodes of the first and second transistors, and a first output terminal provided for the first transistor and a second output terminal provided for the second transistor. Each of the output terminals is connected to a corresponding source or drain electrode that is not connect to the common input terminal. The device further includes a first control terminal provided for the first transistor and a second output terminal provided for the second transistor. Each of the control terminals is connected to a corresponding gate electrode. The device also includes an electrode pad provided for each of the terminals and formed on the substrate, a plurality of wiring connections between the gate electrode of the first transistor and the electrode pad of the first control terminal, and a protecting element formed along each of the wiring connections and having a first high concentration impurity region, a second high concentration impurity region and an insulating region between the first and second high concentration impurity regions. The protecting element is disposed between two electric paths that are connected respectively to the gate and source electrodes of the first transistor or the gate and drain electrodes of the fist transistor.

BRIEF DESCRIPTION OF THE DRAWINGS

FIG. 8 lists characteristic properties of the embodiment.

FIG. 113B is a schematic diagram of the current paths of a b-structure.

DETAILED DESCRIPTION OF THE INVENTION

Figure 1A:
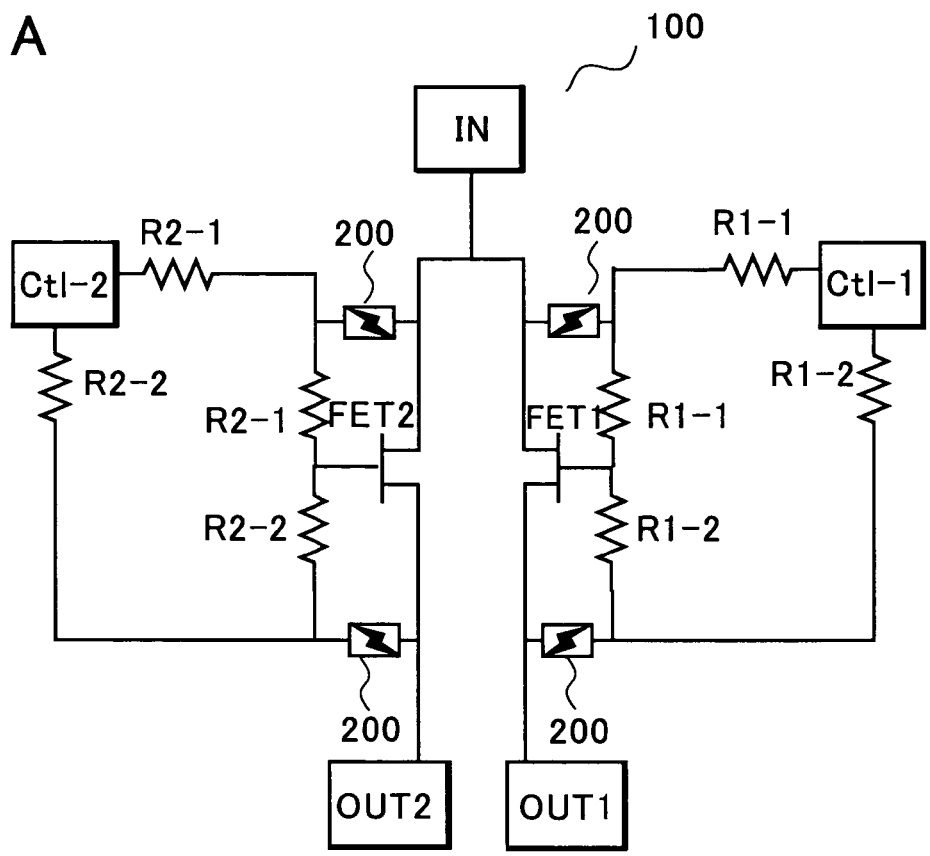
FIGS. 1A and 1B are schematic circuit diagrams of a semiconductor device of an embodiment of the invention.

FIG. 1A is a circuit diagram of a compound semiconductor switching circuit device of an embodiment of this invention. This device is protected by protecting elements as described below.

The source electrodes (or drain electrodes) of first and second FET's, FET1 and FET2, are connected to a common input terminal IN, the gate electrodes of FET1 and FET2 are connected to first and second control terminals Ctl-1 and Ctl-2, respectively, via resistors R1 and R2, respectively, and the drain electrodes (or source electrodes) of FET1 and FET2 are connected to first and second output terminals OUT1 and OUT2, respectively. Note that the symbols R1 and R2 are used to denote resistors R1-1 and R1-2 and resistors R2-1 and R2-1, respectively. The control signals that are applied to the first and second control terminals Ctl-1 and Ctl-2 are complementary signals and the FET to which the H level signal is applied turns ON to make the input signal applied to the common input terminal IN be transmitted to one of the output terminals. The resistors R1 and R2 are disposed to prevent high-frequency signals from leaking via the gate electrodes to the DC potential of the control terminals Ctl-1 and Ctl-2, which are AC grounded. Also, the respective resistors R1 and R2 extend in a plurality of paths from the control terminals Ctl-1 and Ctl-2 and connect to the gate electrodes of FET1 and FET2. In this embodiment, there are, for example, two such paths for each resistor, that is, resistors R1-1 and R1-2 extend from the control terminal Ctl-1 and connect to the gate electrode of FET1 and resistors R2-1 and R2-2 extend from the control terminal Ctl-2 and connect to the gate electrode of FET2.

Figures 24, 25:
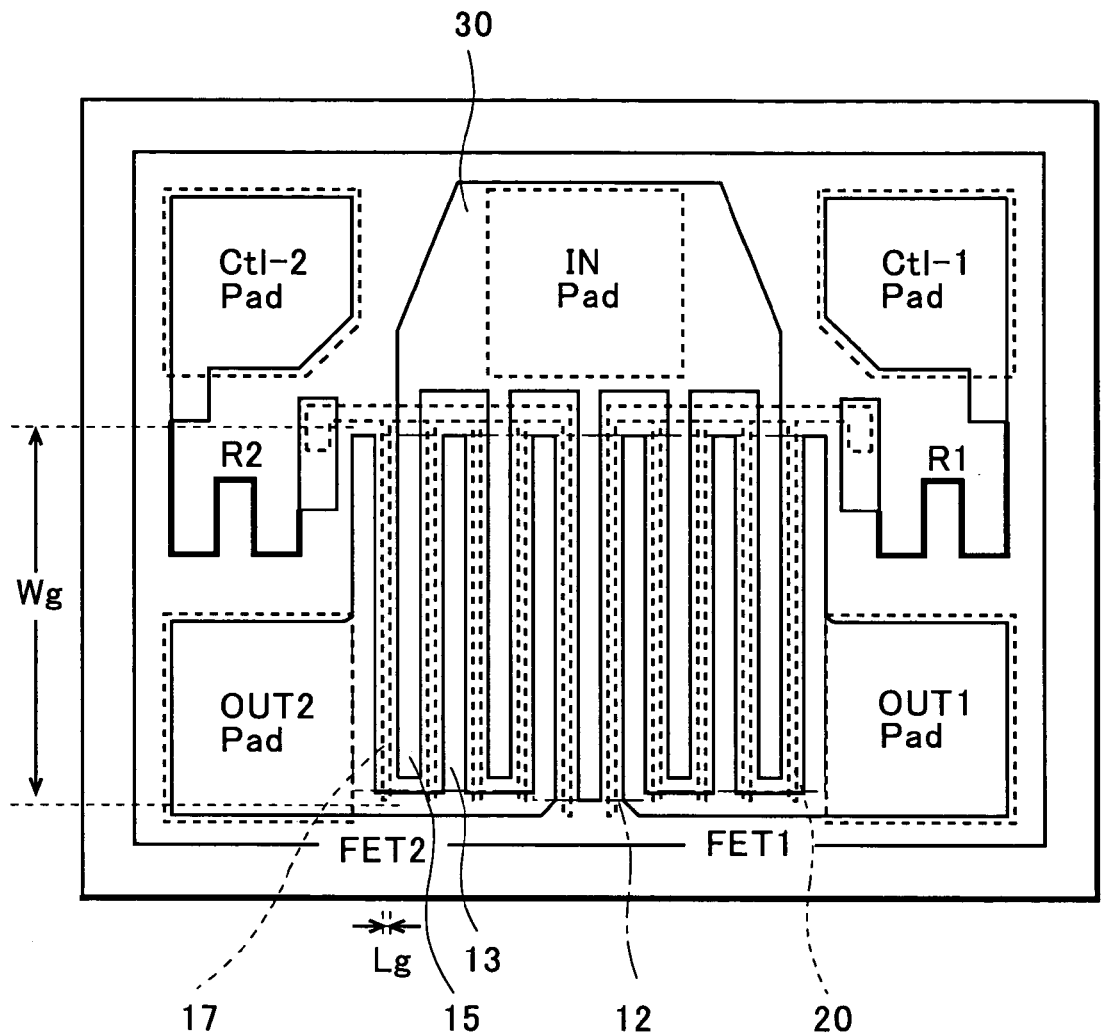
FIG. 24 is a plan view of the device of FIG. 23.
FIG. 25 is a characteristic diagram of the device of FIG. 23.

In the circuit shown in FIG. 1A, protecting elements 200 are connected between the gate electrode and source electrode and between the gate electrode and drain electrode of each of the two FET's of the compound semiconductor switching circuit device, which is shown in FIG. 24. This device is based on GaAs FET's and called an SPDT (Single Pole Double Throw). The control terminal Ctl-1 is connected to the gate electrode of FET1, the control terminal Ctl-2 is connected to the gate electrode of FET2, and the protecting elements 200 are connected respectively between the control terminal Ctl-1 and the common input terminal IN, between the control terminal Ctl-2 and the common input terminal IN, between the control terminal Ctl-1 and the output terminal OUT1, and between the control terminal Ctl-2 and the output terminal OUT2.

Figure 1B:
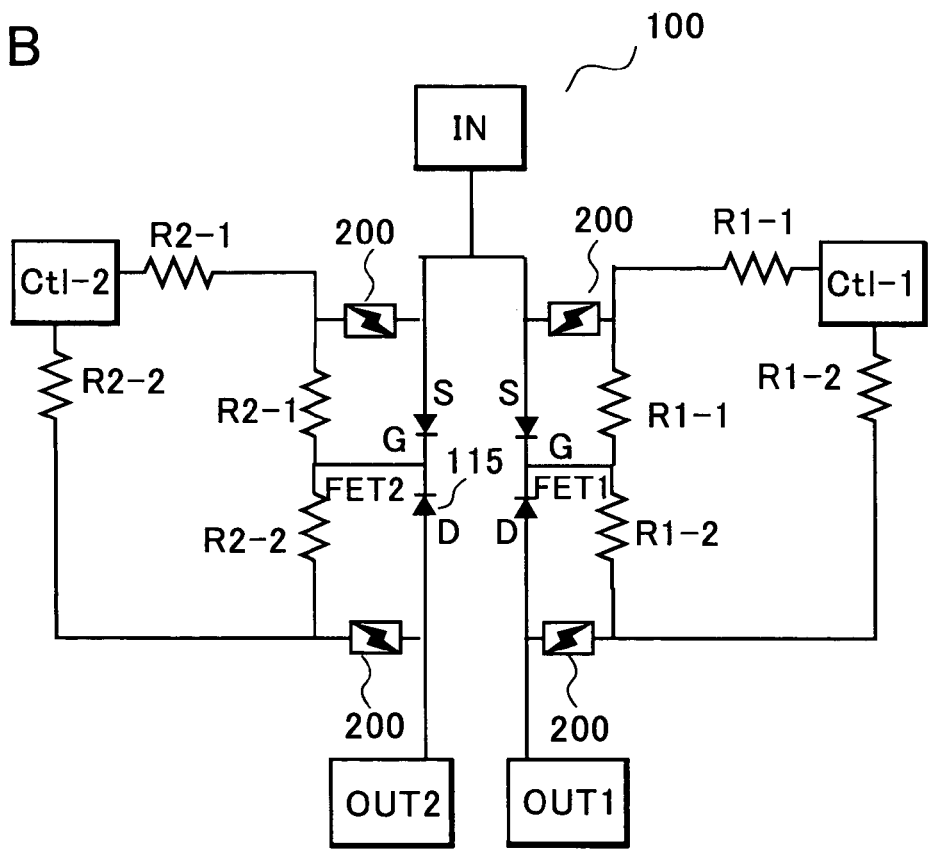

In FIG. 1B, the FET portion of FIG. 1A is replaced by an internal equivalent circuit. In considering the electrostatic breakdown voltage in GaAs MESFET 100, the gate Schottky junction is in a reverse voltage. Thus the equivalent circuit for this state is a circuit in which a Schottky barrier diodes 115 are connected between gate electrode G and source electrode S and between gate electrode G and drain electrode D. For protection from electrostatic breakdown, it is sufficient to reduce the electrostatic energy applied to a gate electrode G Schottky junction, which is a weak junction. In this embodiment, by connecting the protecting element 200 between two electrodes of the MESFET 100 and thereby providing a path to serve as a bypass for partial discharge of electrostatic energy applied between the corresponding two electrodes. Thus, the weak junction is protected from electrostatic breakdown due to the electrostatic charges induced near the junction by a source extrinsic to the device.

Above examples include the protecting elements 200 connected between gate electrode G and source electrode S or between gate electrode G and drain electrode D since a gate Schottky junction or a gate pn junction is weakest against electrostatic breakdown in the FET structure. However, the protecting element 200 may be connected between source electrode S and drain electrode D instead.

Figure 2:
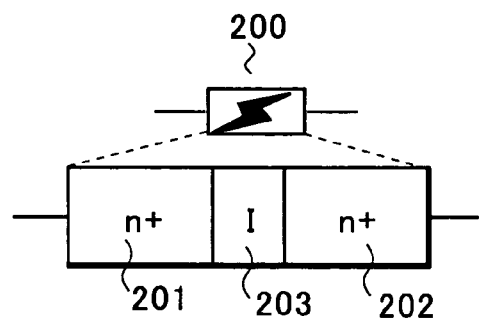
FIG. 2 is a schematic view of a protecting element of this embodiment.

The protecting element 200 will be described with reference to FIG. 2, which is a schematic diagram of the protecting element 200.

The protecting element 200 is an element in which an insulating region 203 is placed between a first high concentration impurity region 201 and a second high concentration impurity region 202 that are placed close to each other. The first and second high concentration impurity regions 201 and 202 are formed by ion implantation or diffusion in a substrate 101. These high concentration impurity regions shall be described hereinafter as a first n+-type region 201 and a second n+-type region 202. The first and second n+-type regions 201 and 202 are separated by a distance that enables passage of electrostatic energy, for example, a distance of approximately 4 µm. The impurity concentration is $1 \times 10^{17}$ cm-3 or more for both regions. The insulating region 203 is placed in contact with and between the first and second n+-type regions 201 and 202. Here, the insulating region 203 is not electrically a complete insulator but is a part of a semi-insulating substrate or an insulating region formed by ion implantation of an impurity into the substrate 101. The insulating region 203 preferably has an impurity concentration of $1 \times 10^{14}$ cm-3 or less and a resistivity of $1 \times 10^3$ Ω·cm or more.

By placing the first and second n+-type regions 201 and 202 in contact with the respective ends of the insulating region 203 and making the distance between the first and second n+-type regions 201 and 202 approximately 4 µm, electrostatic energy, which is applied from the outside between two electrodes of the protected device to which the first and second n+-type regions 201 and 202 are respectively connected, can be discharged via the insulating region 203.

The distance of 4 µm between these two n+-type regions is a suitable distance for passage of electrostatic energy, and with a distance of 10 µm or more, discharge will not occur reliably between these two n+-type regions. The impurity concentration of the insulating region, not the distance, may be adjusted to have a proper device characteristic. Under a normal FET operation, since a voltage as high as that of static electricity will not be applied, a signal will not pass through the insulating region of 4 µm. Likewise, a signal will not pass through the insulating region of 4 µm even in the case of high-frequency operation, such as microwave. Thus, the under normal operation, the protecting element 200 does not change device characteristics at all since it does not influence the characteristics of the FET in any way. However, static electricity is a phenomenon in which a high voltage is applied instantaneously, and in this case, electrostatic energy passes through the insulating region of 4 µm and is discharged between the first and second n+-type regions 201,202. Also, when the thickness of the insulating region becomes 10 µm or more, the resistance becomes large even for static electricity and discharge becomes less likely to occur.

The first n+-type region 201 and the second n+-type region 202 are connected between two electrodes of the protected device 100. The first and second n+-type regions 201 and 202 may be used as the terminals of the protecting element 200 or the metal electrodes 204 may be provided additionally on these n+-type regions.

FIGS. 3A-3D and FIGS. 4A and 4B show devices where the metal electrodes 204 are provided on the protecting element 200. These metal electrodes 204 are connected to bonding pads connected to the electrodes of protected devices MESFET 100 or wiring connected to the bonding pads.

Figure 3A:
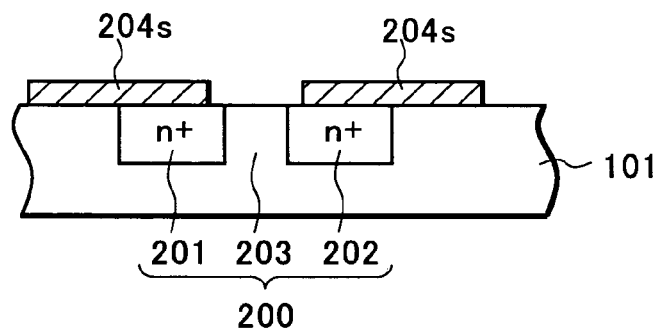
FIGS. 3A-3D are sectional views of the protecting element.
Figure 3B:
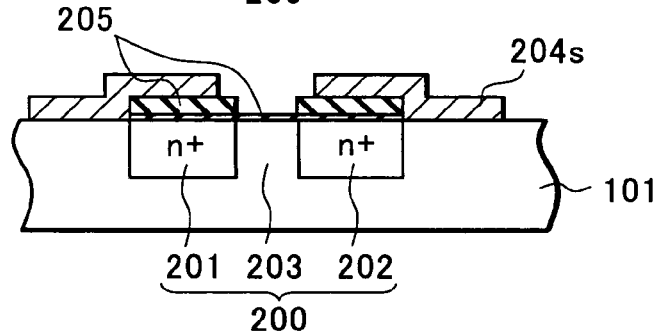
Figure 3C:
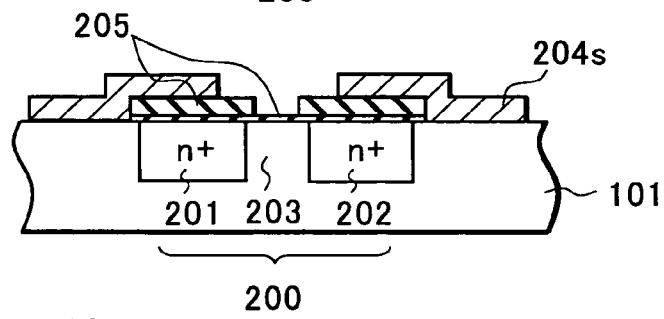
Figure 3D:
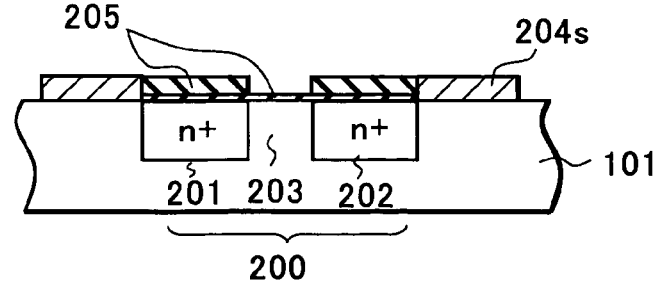
Figure 4A:
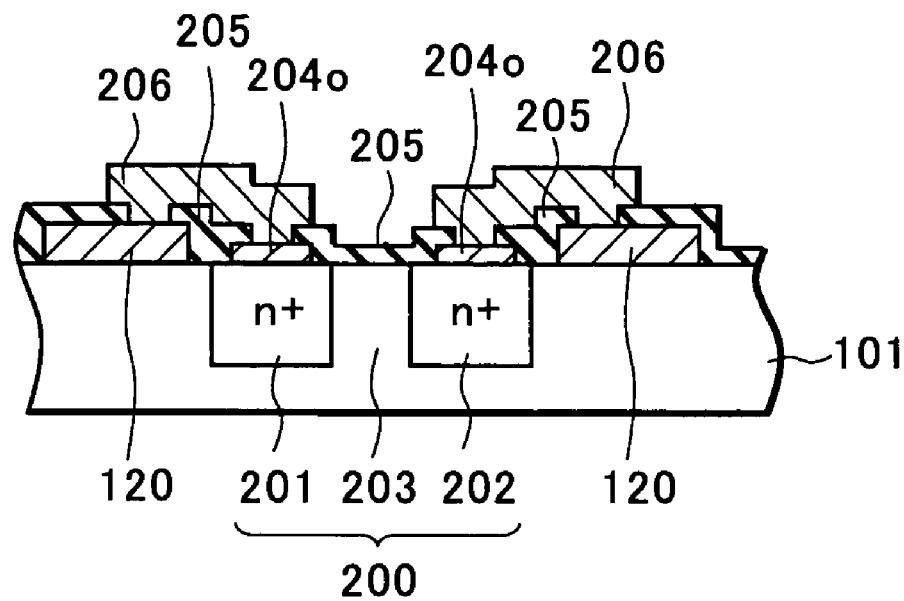
FIGS. 4A and 4B are sectional views of the protecting element.
Figure 4B:
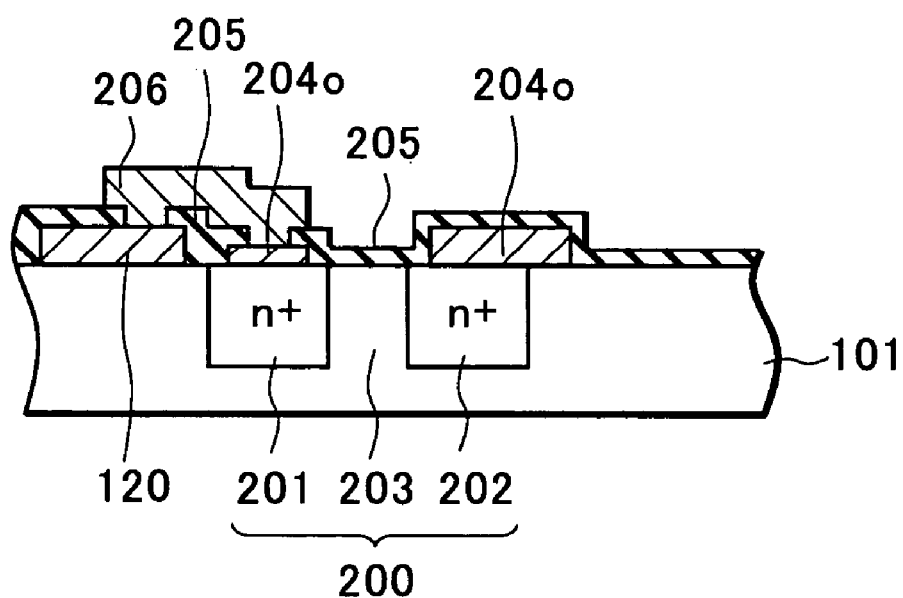

FIGS. 3A-3D show the metal electrodes 204 that form Schottky junctions with the first and second n+-type regions 201 and 202, and FIGS. 4A and 4B show the metal electrodes 204 that form ohmic junctions. Here, for the sake of convenience, these metal electrodes shall be described as a Schottky junction metal electrodes 204s and an ohmic junction metal electrodes 204o.

In FIG. 3A, the metal electrodes 204s form Schottky junctions with the surfaces of the first n+-type region 201 and/or the second n+-type region 202. The electrodes are formed on the surfaces of the first and second n+-type regions 201 and 202 and separated by 0.1 µm to 5 µm from the edge of the insulating region 203 in consideration of the mask aligning accuracy and the resistances of both of the first and second n+-type regions 201 and 202. A separation of 5 µm or more will make the resistance large and will not readily allow the passage of static electricity. The metal electrodes 204s may be formed on just the first and second n+-type regions 201 and 202 or a part thereof may extend to the semi-insulating substrate 101 and form a Schottky junction with the substrate surface.

Or as shown in FIGS. 3B and 3C, the metal electrodes 204s may be disposed on passivation nitride films or other insulating films 205 formed on the first and second n+-type regions 201 and 202. In this case, the metal electrodes 204s are extended onto the semi-insulating substrate 101 and are connected via the substrate 101 to the first and second n+-type regions 201 and 202. Furthermore, as shown in FIG. 3D, a structure, wherein a metal layer is not formed on either the first or second n+-type regions 201 and 202, but the metal electrodes 204s form Schottky junctions with the semi-insulating substrate 101 at the outer sides of these regions, is also possible.

In all of the cases illustrated in FIGS. 3B, 3C, and 3D, the metal electrodes 204s are not connected directly with the first and/or second n+-type regions 201 and 202. The metal electrodes 204s may thus have structures that form Schottky junctions with the substrate approximately 0 µm to 5 µm to the outer side from the ends of the first and/or second n+-type regions 201 and 202. That is, as shown in FIGS. 3B, 3C, and 3D, the first and second n+-type regions 201 and 202 do not have to be in contact with the metal electrodes 204s, and the separation of 5 µm or less provides an adequate connection between the first and second n+-type regions and the metal electrodes 204s via the semi-insulating substrate.

Meanwhile, FIG. 4 show the metal electrodes 204o that form ohmic junctions with the first and/or second n+-type regions.

The metal electrodes 204o may form ohmic junctions with the first and/or second n+-type regions 201 and 202. Since the metal electrodes 204o cannot form ohmic junctions with the semi-insulating substrate 101, the metal electrodes 204o are not extended onto neighboring parts of the substrate 101. The metal electrode 204o is connected to a bonding pad (or a wiring connected to the bonding pad) 120 of the protected device, and in the case of an ohmic junction, the metal electrode 204o is connected to the bonding pad (or the wiring) 120 via another metal layer 206.

An ohmic junction has a resistance lower than a Schottky junction, and passes static electricity more readily. In this regard, an ohmic junction provides a larger protection effect against electrostatic breakdown than a Schottky junction.

However, with the ohmic junction, the metal electrode 204o is diffused deeply into the substrate and when the metal electrode 204o reaches the depth of the n+-type region or more, the metal electrode 204o contacts the semi-insulating region of the substrate and in this case, the protecting element 200 itself readily undergoes electrostatic breakdown.

For example, if a metal is provided to form ohmic junctions with the first n+-type region 201 and the second n+-type region 202, the distance between ohmic junctions is 10 µm, and the metal electrode 204o is diffused to the semi-insulating region of the substrate at the depth of the first and second n+-type regions 201 and 202 or more, an ohmic junction—insulating region—ohmic junction structure is formed at parts deeper than the depth of the n+-type regions. Since it is known that this structure is weak against electrostatic energy, it is likely that the protecting element itself will undergo electrostatic breakdown.

When the metal electrode 204o is expected to diffuse to the semi-insulating region of the substrate at the depth of the two n+-type regions or more, Schottky junctions must be formed instead, and when the metal electrode 204o does not reach the depth of the n+-type regions, ohmic junctions provide a greater protection effect.

Also, as shown in FIG. 4B, it is not necessary for both of the two terminals of the protecting element 200 to have the same metal electrode structure, and each of the first and second n+-type regions may have any of the structures shown in FIGS. 3A-3D and FIGS. 4A and 4B independently. Furthermore, although it is possible that one of the terminals has the metal electrode 204 and another terminal does not have the metal electrode 204, the formation of metal electrodes is preferable in that the resistance is decreased and the protection effect is increased accordingly.

Such a metal electrode 204 may be a part of a bonding pad or a part of a wiring connected to a bonding pad. Using such bonding pads and wiring, i.e., the integration of the protecting element 200, can reduce the total chip size.

The type of the protecting element 200, which is integrated on the same substrate as FET 100, shall now be described using FIGS. 5A-5D. An operating region 108 of the above-described FET 100 may be of any of the structures described below. In each of FIGS. 5A to 5D, the left diagram shows the FET's operating region 108 and the right diagram shows the protecting element 200, which is integrated on the same substrate.

Figure 5A:
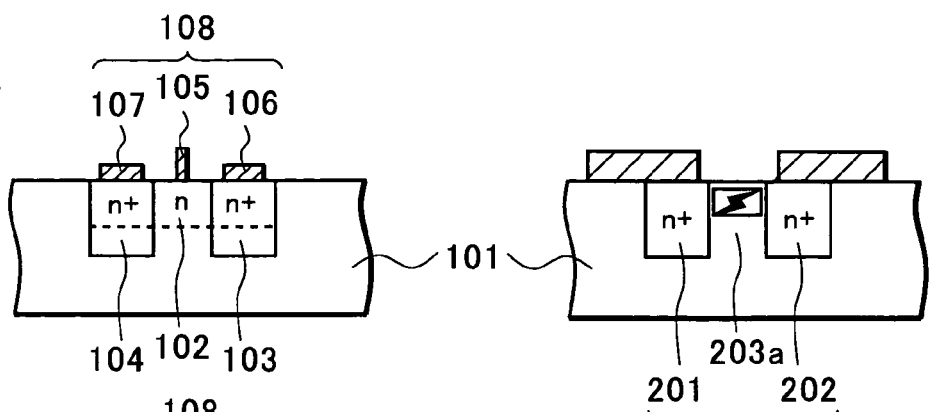
FIGS. 5A-5D are a sectional views of the protecting element.

First, in the device shown in FIG. 5A, an n-type operating layer 102 is formed, for example, by ion implantation on the semi-insulating substrate 101, and at the respective ends of this layer, an n+ type source region 103 and a drain region 104 are formed to form the operating region 108. This is a MESFET in which a source electrode 106 and the drain electrode 107 are formed as ohmic electrodes above the source region 103 and the drain region 104. A gate electrode 105, which forms Schottky junction with n-type operating layer 102, is provided. In this case, the two terminals (the first and second n+-type regions 201 and 202) of the protecting element 200 are preferably formed at the same time as the source region 103 and the drain region 104 of the operating region 108 for the simplification of processes. And the two terminals are separated by 4 µm from each other on the semi-insulating substrate 101. The protecting element 200 has the first n+-type region 201, a semi-insulating region 203a and the second n+-type region 202. In this case, the protecting element 200 protects the gate Schottky junction from electrostatic breakdown.

Figure 5B:
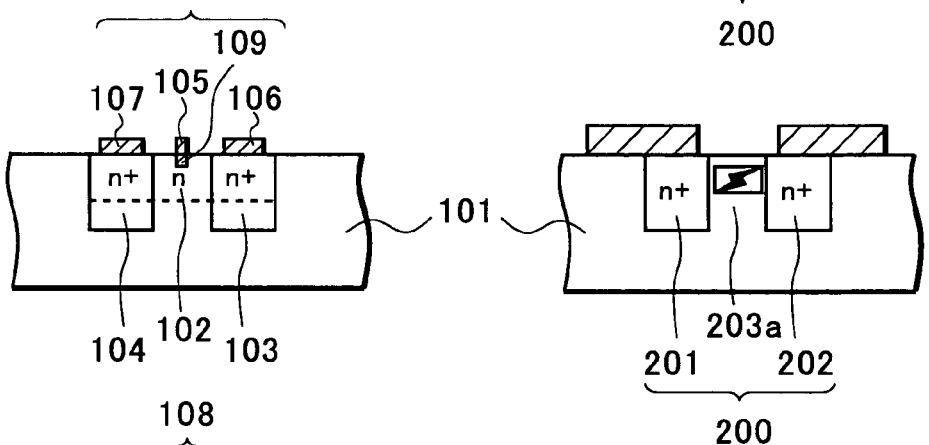

In the FET of FIG. 5B an n-type operating layer 102 is formed, for example, by ion implantation on the semi-insulating substrate 101, and at the respective ends of this layer, the n+ type source region 103 and the drain region 104 are formed to form the operating region 108. This is a junction type FET in which the source electrode 106 and the drain electrode 107 are formed as ohmic electrodes above the source region 103 and the drain region 104. The gate electrode 105, which forms ohmic junction with a p+-type gate region 109 formed inside n-type operating layer 102, is provided. In this case, the two terminals (the first and second n+-type regions 201 and 202) of the protecting element 200 are preferably formed at the same time as the source region 103 and the drain region 104 of the operating region 108 for the simplification of processes. And they are separated by 4 µm from each other on the semi-insulating substrate 101. The protecting element 200 has the first n+-type region 201, the semi-insulating region 203a and the second n+-type region 202. In this case, the protecting element 200 protects the gate pn junction from electrostatic breakdown.

Figure 5C:
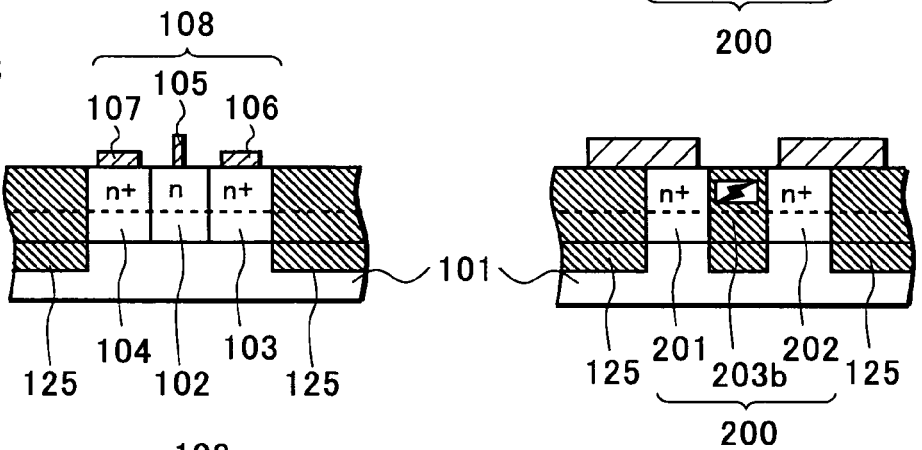

Operating layer 102 of the FET of FIG. 5C is, for example, fabricated with an n type epitaxial layer onto the semi-insulating substrate 101, and at the respective sides of this layer, a n+-type impurity is implanted to form the source region 103 and the drain region 104. This is a MESFET wherein the source electrode 106 and the drain electrode 107 are formed as ohmic electrodes above the source region 103 and the drain region 104. The gate electrode 105, which forms Schottky junction with n-type operating layer 102, is provided. This element is isolated from other neighboring elements by an insulated layer 125 formed by impurity implantation. Since the surface of the protecting element 200 that is integrated on the same chip is an n-type epitaxial layer, the area between the first and second n+-type regions is formed as an insulated region 203b by impurity implantation. The outer sides of the respective terminals are likewise isolated by the insulated layer 125, formed by impurity implantation. The insulated region 203b of the protecting element 200 and the insulated layer 125 for element isolation are preferably formed in the same process. Also, the first and second n+-type regions 201 and 202 are preferably formed at the same time as the source and drain regions of the operating region 108. The protecting element 200 has the first n+-type region 201, the insulated region 203b and the second n+-type region 202. The protecting element 200 protects the gate Schottky junction from electrostatic breakdown.

The same device structure as that of FIG. 5B may be applied to this n-type epitaxial-operating layer device. In this case, the protecting element 200 protects the gate pn junction from electrostatic breakdown.

Figure 5D:
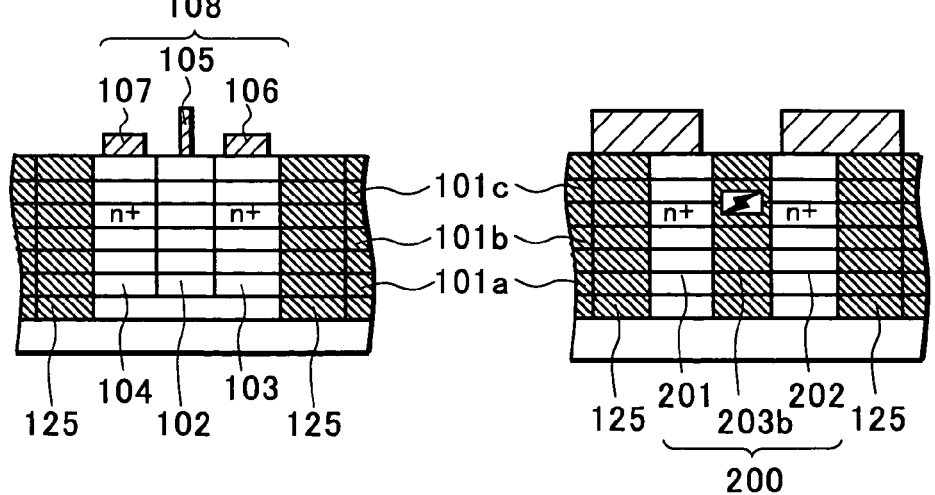

Besides MESFET's and junction type FET's, an HEMT (High Electron Mobility Transistor) may have similar protection structures, as shown in FIG. 5D.

In this structure, an n++AlGaAs layer 101a, an undoped InGaAs layer 101b, and an n++AlGaAs layer 101c are formed as epitaxial layers successively on the semi-insulating substrate 101. The source electrode 106 and the drain electrode 107 are formed as ohmic electrodes above the source region 103 and the drain region 104, formed by n+-type ion implantation at the respective ends of operating layer 102, which is formed of the plurality of layers. The gate electrode 105 that forms Schottky junction with the operating layer surface is provided. This element is isolated from other neighboring elements by the insulated layer 125 formed by impurity implantation. Also, as shown on the right in FIG. 5D, since the surface of the protecting element 200 that is integrated on the same chip has the same substrate structure, the protecting element 200 has a structure in which the insulated region 203b is located between the first and second n+-type regions that are formed at the same time as the source region 103 and the drain region 104. Furthermore, the outer sides of the respective terminals are likewise isolated by the insulated layer 125, formed by impurity implantation. The insulated region 203b of the protecting element 200 and the insulated layer 125 for element isolation are preferably formed in the same process. Also, the first and second n+-type regions are preferably formed at the same time as the source and drain regions of the operating region 108. In this case, the protecting element 200 protects the gate Schottky junction from electrostatic breakdown.

Figure 6:
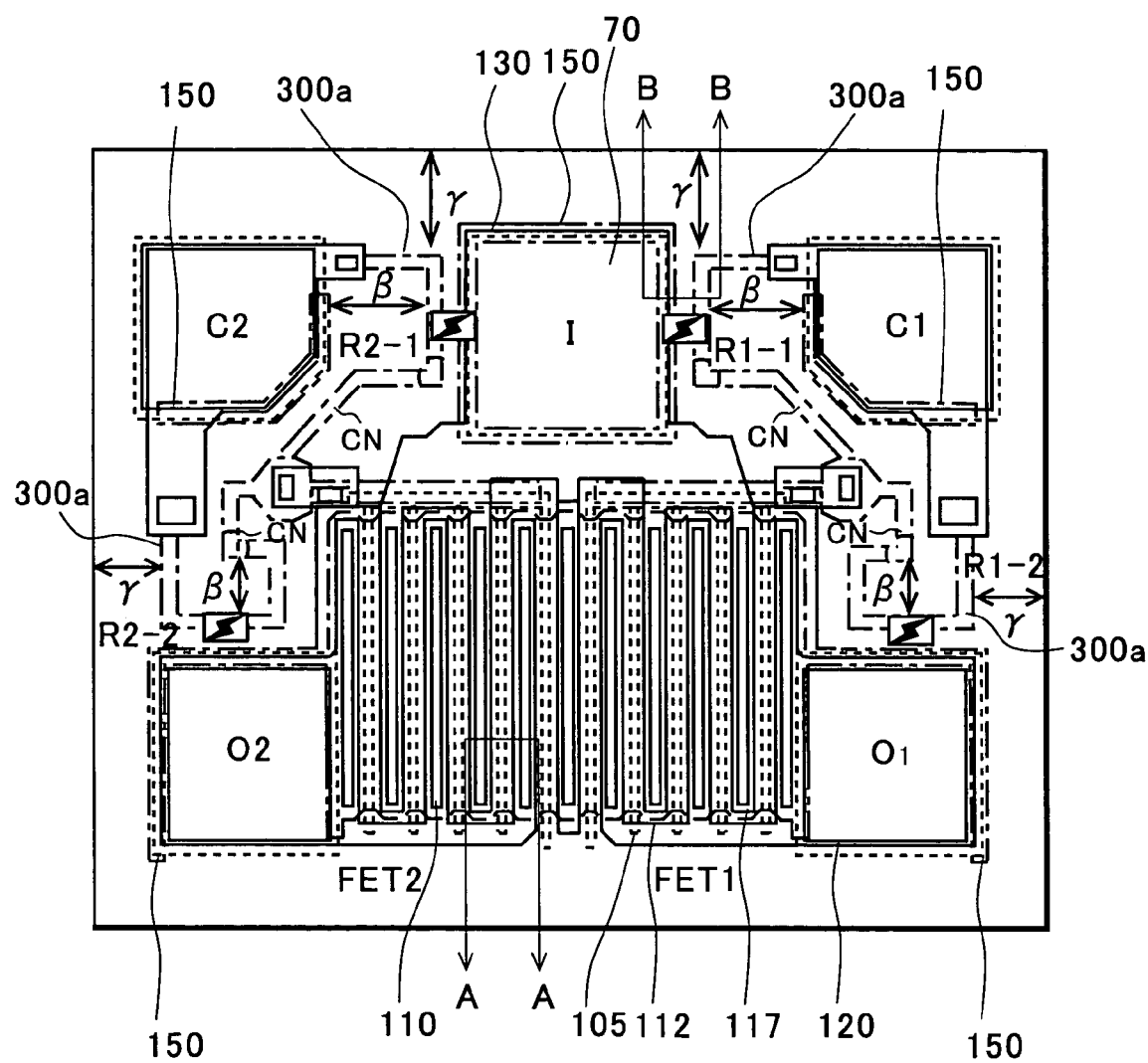
FIG. 6 is a plan view of the semiconductor device of the embodiment.

FIG. 6 is a plan view of a device in which the switching circuit device shown in FIG. 1 is integrated in a single chip.

FET1 and FET2 for switching are arranged at central parts of the GaAs substrate 101, and the resistors R1 and R2 are connected to the gate electrodes 105 of the respective FETs. The resistors R1 and R2 extend in two paths each from the control terminals Ctl-1 and Ctl-2, respectively, and connect with the respective gate electrodes on the operating regions of FET1 and FET2.

In addition, electrode pads I, O1, O2, C1 and C2, connecting to the common input terminal IN, the output terminals OUT1 and OUT2, the control terminals Ctl-1 and Ctl-2, respectively, are provided at the surroundings of FET1 and FET2 at the periphery of the substrate. A second-layer wiring, indicated by dotted lines, is the gate metal layer (Ti/Pt/Au) 120 formed at the same time the gate electrodes 105 of the respective FETs are formed, and a third-layer wiring, indicated by solid lines, is a pad metal layer (Ti/Pt/Au) 130 for connection of the respective elements and pad formation. An ohmic metal layer (AuGe/Ni/Au) of the first metal layer, which is in ohmic contact with the substrate, forms the source electrodes and drain electrodes of the respective FETs, and forms electrodes at the ends of the respective resistors, and this layer is not illustrated in FIG. 6 since it overlaps with the pad metal layer.

FET1 and FET2, shown in FIG. 6, are formed on an operating region 112, which is surrounded by alternate long and short dash lines. The three-teeth-comb-shaped third-layer pad metal layer 130 parts, which extend from the lower side, include a source electrode 116 (or drain electrode) connected to the output terminal OUT1, and below this is disposed the source electrode 106 (or drain electrode) formed by the first-layer ohmic metal layer. Also, the three-teeth-comb-shaped third-layer pad metal layer 130 parts, which extend from the upper side, include a drain electrode 117 (or source electrode) connected to the common input terminal IN, and below this is disposed the drain electrode 107 (or source electrode), formed by the first-layer ohmic metal layer. These electrodes are in the form of engaged comb teeth, and the gate electrode 105, formed by the second-layer gate metal layer 120, is formed between them on the operating region 112 in the form of five comb teeth. The drain electrode 117 (or source electrode) that forms the central comb tooth extending from the upper side is used in common by FET1 and FET2 for size reduction. Here, the gate width, the total gate width of the comb-shaped gate electrode 105 of each FET, is 600 μm.

In this embodiment, the connections extend in two paths from each of the electrode pads C1 and C2, connecting to the control terminals Ctl-1 and Ctl-2, respectively, and connect to the gate electrodes 105 on the operating region 112. That is, from the control terminal pad C1, the resistors R1-1 and R1-2 extend and connect to the gate electrode 105 of FET1. Also, from the control terminal pad C2, the resistors R2-1 and R2-2 extend and connect to the gate electrode 105 of FET2.

The resistor R1 and the resistor R2 are n+-type impurity diffused regions formed on the substrate. Each of the resistors R1-1, R1-2, R2-1, and R2-2 has a resistance of 20 KΩ. With the parallel connection of the resistors R1-1 and R1-2, R1 has a total resistance of 10 KΩ. Likewise, with the parallel connection of the resistors R2-1 and R2-2, R2 has a total resistance of 10 KΩ. The resistors R1 and R2 are thus designed to be the same in resistance value as the resistors R1 and R2 of the related art shown in FIG. 24.

In this embodiment, if the resistance is to be realized by forming the resistors R1 and R2 from just the n+-type impurity diffused region, the length of each resistor will be too long and the area on the chip that is taken up by these resistors will be large. Thus a part of each of the resistors R1 and R2 is formed of an n-type impurity region CN of the same concentration as the n layer of the channel region, which is high in sheet resistance. These are then used for connecting the control terminal pads C1 and C2 to the gate electrodes on the operating region 112. Where possible, the entire connections may be made with the n+-type impurity diffused regions or the entire connections may be made with the n-type impurity regions CN.

Figure 7A:
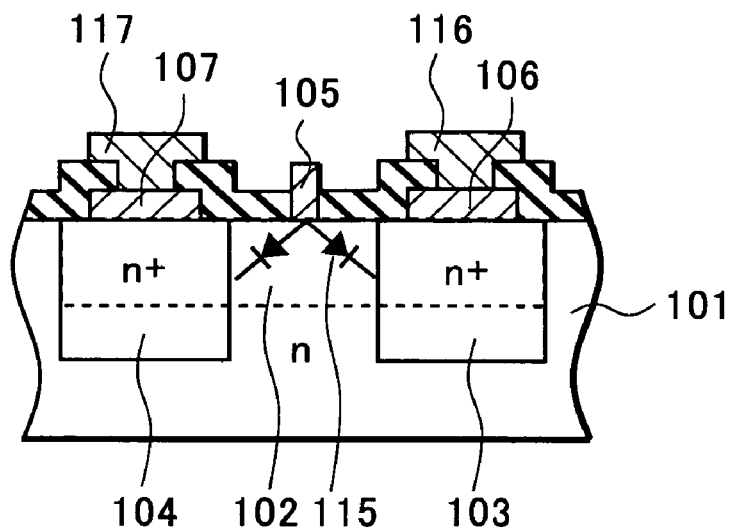
FIGS. 7A and 7B are sectional views of the device of FIG. 6.
Figure 7B:
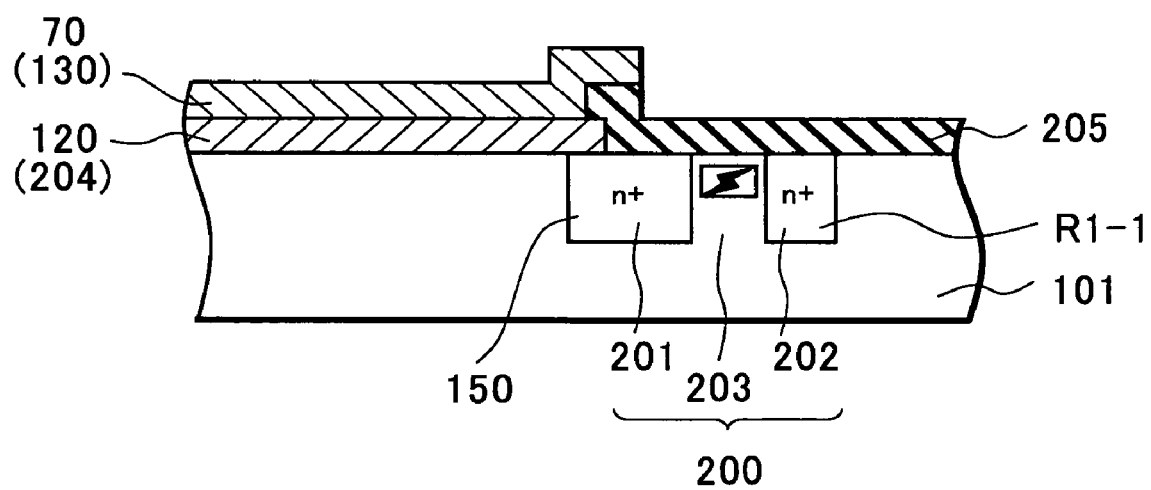

FIGS. 7A and 7B show a sectional view and a schematic circuit diagram of a part of the switching circuit device shown in FIG. 6. FIG. 7A is sectional view along line A-A of FIG. 6 and shows a single FET. Both FET1 and FET2, which perform the switching operations in the switching circuit device, are of the same arrangement.

As shown in FIG. 7A, on the substrate 101, an n-type operating layer 102 is formed, and on the respective sides of this layer are disposed n+-type impurity regions that form the source region 103 and the drain region 104. The gate electrode 105 is disposed on operating layer 102, and the drain electrode 107 and the source electrode 106, formed of the first-layer ohmic metal layers, are formed on the impurity regions. Above these are formed the drain electrode 117 and the source electrode 116, formed of the third-layer pad metal layer 130 and providing the wiring of the respective elements.

The MESFET is the weakest against electrostatic breakdown when a surge voltage is applied between gate electrode 105 and source electrode 106 or between gate electrode 105 and drain electrode 107, both of which are small in gate Schottky junction capacitance, with the gate electrode 105 side being made negative. In this case, static electricity is applied in reverse bias to the Schottky barrier diodes 115 formed at the interface between the operating region 108 and the gate electrode 105, which is formed on the surface of the operating region 108 (See FIG. 1B).

In a FET, a Schottky junction part between the gate electrode 105 and operation layer 102 is the lowest in electrostatic breakdown voltage. Namely, when electrostatic energy applied between the gate electrode and drain electrode or between gate electrode and source electrode reaches the gate Schottky junction, the gate Schottky junction is damaged if the electrostatic energy exceeds the electrostatic breakdown voltage between the gate electrode and source electrode or between the gate electrode and drain electrode of the channel region.

For protection from electrostatic breakdown, it is sufficient to reduce the electrostatic energy applied to the gate electrode Schottky junction, which is a weak junction. In this embodiment, by connecting the protecting element 200 between two electrodes of MESFET 100 and thereby providing a path to serve as a bypass for partial discharge of electrostatic energy applied between the corresponding two electrodes. Thus, the weak junction is protected from electrostatic breakdown due to the electrostatic charges induced near the junction by a source extrinsic to the device.

As shown in FIG. 6, in this embodiment, the protecting elements 200 are respectively connected between the two terminals of source electrode 106 and gate electrode 105 and between the two terminals of drain electrode 107 and gate electrode 105 of FET1 (FET2). That is, the protecting elements 200 are respectively connected between the output terminal OUT1 and the control terminal Ctl-1, between the common input terminal IN and the control terminal Ctl-1, between the output terminal OUT2 and the control terminal Ctl-2, and the common input terminal IN and the control terminal Ctl-2. Paths, each serving as a bypass that partially discharges the electrostatic energy applied to the corresponding two terminals, are thus formed. The electrostatic energy that is applied to an FET's gate Schottky junction, which is a weak junction, can thereby be reduced.

FIG. 7B shows a sectional view along line B-B of the vicinity of an electrode pad. All of the respective electrode pads of the switching circuit device are of the same configuration.

As illustrated, a pad peripheral n+-region 150, which is a third high concentration impurity region, is disposed at the periphery of the electrode pad 70 to prevent the leakage of high frequency signals from the electrode pad 70. The lowermost gate metal layer 120 of each the electrode pad 70 forms a Schottky junction with the GaAs semi-insulating substrate, and the pad peripheral n+region 150 and each electrode pad form a Schottky junction.

That is, a part of the resistor R1-1 (the same applies to R1-2) and a part of the pad peripheral n+region 150, which is a third high concentration impurity region, sandwich the semi-insulating substrate 101 to form the protecting element 200. Though the metal electrode 204 is a part of the common input terminal pad I (the same applies to the output terminal pad O1), formed of the gate metal layer 120, it may instead be a part of a wiring connected to the common input terminal pad I (see FIG. 3B). This connection example is just one example, and all connection forms shown in FIG. 3 are applicable.

Here, since the FET1 side and the FET2 side are symmetrical and are exactly the same, a description shall be provided for the FET1 side as an example. In the device of FIG. 24, the electrostatic breakdown voltage is the lowest at 140 volts between the common input terminal IN and the control terminal Ctl-1 (See FIG. 25). The electrostatic energy applied between the common input terminal IN and the control terminal Ctl-1 must be at least partially released before it reaches the gate electrode and the corresponding electrode, i.e., the source electrode or the drain electrode, of the transistor so that the transistor is not damaged.

One approach to achieve the above is to increase the resistor R1's resistance. However, if the resistor R1 is increased, switching time of the switching circuit device becomes long. Therefore, in this embodiment, the electrostatic energy is released by use of the protecting element 200 but not by increasing the resistance.

Here, as mentioned above, the resistor R1 is formed of the n+-type impurity region. The resistor R1-1, extending from the control terminal pad C1, extends along one side of the common input terminal pad I. Also, the resistor R1-2 extends along one side of the output terminal pad O1 from the control terminal Ctl-1. Both resistors include the n+ layer and the n layer along the path and, connect to the gate electrode 105 of FET1.

By positioning the resistor R1-1 close to the common input terminal pad I, the distance between the n+-type region that makes up the resistor R1-1 and the nearby pad peripheral n+-type region 150 becomes 4 μm, and the protecting element 200 is thus formed across the semi-insulating substrate 101. A part of the resistor R1-1 is the first n+-type region 201 and a part of the pad peripheral n+-type region 150 at the periphery of the common input terminal pad I is the second n+-type region 202. This design is the same as connecting the protecting element 200 between the common input terminal IN and the control terminal Ctl-1, that is, between the source and gate electrodes (or between the drain and gate electrodes) of FET1.

Also, the protecting element 200 can be placed at a position that is close to the common input terminal pad I and the control terminal pad C1 and is along the path through which static electricity is transmitted from the control terminal pad C1 to the gate electrode on the operating region. Electrostatic energy, which is applied to the switching circuit device from the exterior, can thus be released at the beginning of the paths through which electrostatic energy is transmitted to the gate electrode.

Likewise, by positioning the resistor R1-2 near the output terminal pad O1, the distance between the n+-type region that makes up the resistor R1-2 and the nearby pad peripheral n+-type region 150 becomes 4 μm, and the protecting element 200 is thus formed across the semi-insulating substrate 101. A part of the resistor R1-2 is the first n+-type region 201 and a part of the pad peripheral n+-type region 150 at the periphery of the output terminal pad O1 is the second n+-type region 202. This design is the same as connecting the protecting element 200 between the output terminal OUT1 and the control terminal Ctl-1, that is, between the drain and gate electrodes (or between the source and gate electrodes) of FET1.

Also, the protecting element 200 can be connected at a position that is close to the output terminal pad O1 and the control terminal pad C1, and is along a path through which static electricity is transmitted from the control terminal pad C1 to the gate electrode on the operating region.

By extending the connection through two paths that run along the common input terminal pad I and the output terminal pad O1 from the control terminal Ctl-1 and connecting the protecting elements 200 to the paths, the electrostatic energy applied between the output terminal OUT1 and the control terminal Ctl-1 and the electrostatic energy applied between the common input terminal IN and the control terminal Ctl-1 can both be released to the same degree and most efficiently.

It is desirable that the length of the protecting element 200 along the pad is 10 µm or more, because the longer the length is, the more electrostatic energy can be released.

In FIG. 6, the protecting element 200 is arranged along one side of the common input terminal pad I. However, if the resistor R1-1 is arranged in an L shape along two sides of the common input terminal pad 1, this is more effective in releasing the electrostatic energy as the length of the protecting element 200 is longer. The same configuration is applicable to the output terminal pad O1.

By connecting the protecting elements 200 between the common input terminal IN and the control terminal Ctl-1 and between the common input terminal IN and the control terminal Ctl-2 of the switching circuit device as described above, the electrostatic breakdown voltage between these terminals can be raised up to 700V.

When there is no resistor between a gate electrode and a gate pad (the control terminal pads C1, in this embodiment), for an FET with a gate length of 0.5 µm and a gate width of 600 µm, the electrostatic breakdown voltage between the a gate and source electrodes or between the gate and drain electrodes is no more than approximately 50 V. The gate Schottky junction on the operating region of the FET has an electrostatic breakdown voltage of no more than approximately 50 V.

The FET of this embodiment also has a gate length of 0.5 µm and a gate width of 600 µm, and the electrostatic breakdown voltage of the gate Schottky junction of this FET will also be no more than approximately 50 V without the protection scheme described above. However, in a switching circuit device, the resistors R1 will always exist between a gate electrode and a gate pad (the control terminal pad C1), such as those of this embodiment. Since a part of the electrostatic energy is consumed as heat in the resistors R1, measurements of the electrostatic breakdown voltage between the common input terminal IN and the control terminal Ctl-1 (or likewise between the output terminal OUT1 and the control terminal Ctl-1, which is connected the resister R1-2) of the switching circuit device showed that the electrostatic breakdown voltage was improved somewhat, i.e., approximately 100V, even if the protecting element 200 is not connected.

Furthermore, when the protecting element 200 is connected, the electrostatic energy is bypassed and discharged in the protecting element 200. Thus, the measured value of the electrostatic breakdown voltage increased to 200V or more due to discharge in the protecting element 200.

In other words, the electrostatic energy that is applied between the common input terminal IN and the control terminal Ctl-1 is consumed partially as heat in the resistor R1-1, consumed further by discharge in the protecting element 200, and becomes smaller than the breakdown voltage of gate Schottky junction on the operating region 112 when the electrostatic energy reaches gate electrode on the operating region 112.

FIG. 8 shows the results of measuring the electrostatic breakdown voltages of the switching circuit device of FIG. 6. The electrostatic breakdown voltage is 700V between the common input terminal IN and the control terminal Ctl-1 and between the common input terminal IN and the control terminal Ctl-2. This is a significant improvement over the break down voltage (140V) of the conventional device. Likewise, the electrostatic breakdown voltage is 700V between the output terminal OUT1 and the control terminal Ctl-1 and between the output terminal OUT2 and the control terminal Ctl-2, and improved over the related art values of 450 to 500V.

The mechanism for the above shall now be described for a case where the actual value of the electrostatic breakdown voltage of the gate Schottky junction of the operating region 112 of the FET is 50V.

As mentioned above, the gate Schottky junction of the operating region 112 of the FET breaks down at 50V. Also, in the conventional device, the electrostatic breakdown voltage between the common input terminal IN and the control terminal Ctl-1 is 140V as shown in FIG. 25. This value is obtained when the protecting element 200 is not provided and the electrostatic energy applied between the common input terminal IN and the control terminal Ctl-1 reaches the operating region 112 upon being consumed partially in the resistor R1-1. That is, the electrostatic energy of the amount corresponding to 90 volts (140 V−50 V) is consumed as heat in the resistor R1-1 between the gate electrode 105 and the control terminal pad C1, and the Schottky junction breaks down at the point at which 50V is applied to the gate Schottky junction of the operating region 112 of the FET.

In this embodiment, measurements of the electrostatic breakdown voltage between the common input terminal IN and the control terminal Ctl-1 show that breakage occurs at 700V as shown in FIG. 8. The Schottky junction of the operating region 112 of the FET breaks down at 50V, the electrostatic energy that is consumed as heat in the resistor R1-1 between the gate electrode 105 and the control terminal pad C1 is of the amount corresponding to 90 V.

That is, the electrostatic energy of the amount corresponding to 560 volts (700−(50+90)) is discharged in the protecting element 200 and this amount is thus consumed as heat. The amount (560V) that is the surplus over the amount corresponding to the electrostatic breakdown voltage of the Schottky junction of the operating region 112 and the amount consumed in the resistor R1-1 is discharged in the protecting element 200.

Here, the pad peripheral n+-type regions 150, indicated by alternate long and short dash lines, are provided below the peripheral end part of the common input terminal pad I, the control terminal pads C1 and C2, and the output terminal pads O1 and O2, and also below the peripheral end part of the gate electrodes besides the operating regions of the two FET's. The pad peripheral n+-type regions 150 may be provided not just at peripheral end parts but also over the entire surfaces directly below the respective pads and the gate electrodes 105 besides the operating regions of the two FET's. Furthermore, the pad peripheral n+-type regions 150 may be provided adjacent to and at peripheral parts of the common input terminal pad I, the control terminal pads C1 and C2, the output terminal pads O1 and O2, and not directly below these pads. In addition, the pad peripheral n+-type regions 150 may be provided adjacent to and at peripheral parts of the gate electrode besides the operating regions, and not directly below the gate electrode. These pad peripheral n+-type regions 150 are formed at the same time as when the source and drain regions are formed and the distance of parts at which these pad peripheral n+-type regions 150 and the resistors R1 and R2 are adjacent each other is 4 µm.

That is, a plurality of these pad peripheral n+-type regions 150 and the resistors R1 and R2 may be connected within the same chip as both terminals of the protecting elements 200.

The terminals of the protecting elements 200 may be connected to bonding pads via metal electrodes or may be the wiring of the resistors R1 and R2 that connect the bonding pads with the gate electrode on the operating regions 112.

This embodiment is explained using as an example a switching device having an FET having a source electrode, gate electrode and a drain electrode on an operating region of a substrate. However, this embodiment is not limited to the above-described three electrode arrangement and may also be applied to a dual gate FET having a total of four electrodes, a triple gate FET having a total of five electrodes and other devices having different number of electrodes.

The shape and connection position of the protecting element 200 shall now be described further. Since an electrostatic current is generated when the static electricity is applied to the protecting element 200, the protection effect can be improved by making a larger amount of electrostatic current flow through the protecting element 200. That is, the shape and connection position of the protecting element 200 should be considered towards making a larger amount of electrostatic current flow through the protecting element 200.

As described above, the protecting element 200 of this embodiment has a structure in which the first n+-type region 201 and the second n+-type region 202 face each other and the insulating region 203 is formed at the periphery of both regions.

Figure 9:
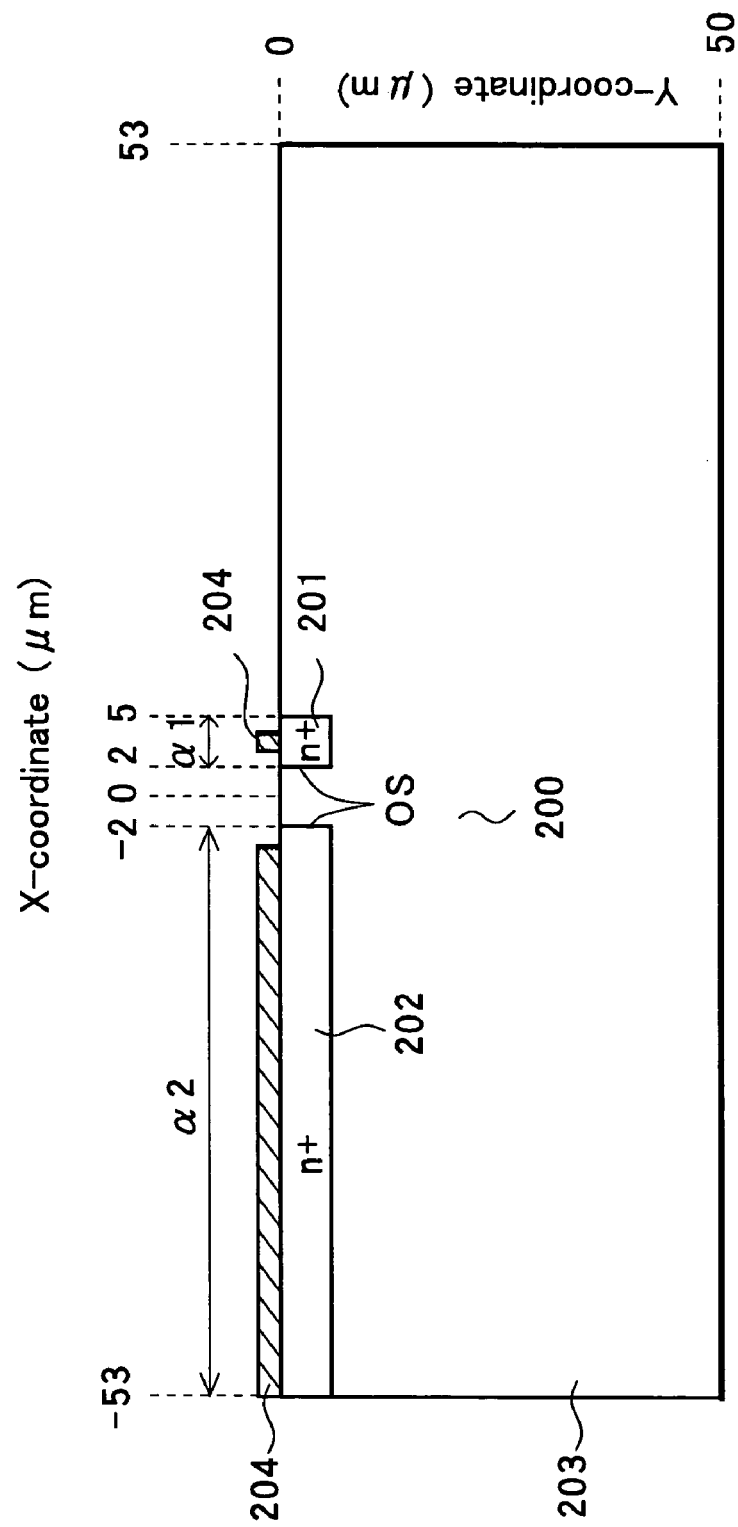
FIG. 9 is a cross-sectional model diagram of a device simulation for the protecting element.

As shown in FIG. 9, the n+-type region 201 has one side surface that opposes the second n+-type region 202 and a side surface at the opposite side. Likewise, the second n+-type region 202 also has one side surface that opposes the first n+-type region 201 and a side surface at the opposite side. The side surfaces at the side at which the two regions oppose each other shall be referred to as the opposing surface OS.

In addition, this embodiment's second n+-type region 202 is not restricted to a single diffusion region. That is, all high concentration impurity regions, which are formed so as to oppose the first n+-type region 201 and are used for the discharge of electrostatic energy, are referred to inclusively. That is, as long as it is disposed so as to oppose the first n+-type region 201, the second n+-type region 202 may be arranged from a single impurity diffusion region or may be a set of a plurality of partitioned impurity regions.

Also, in a case where the second n+-type region 202 is partitioned into a plurality of types, the partitioned parts do not have to be directly continuous and may be discontinuous. That is, with the second n+-type regions 202 that are connected to the same terminal of the same protected device and are opposed to the first n+-type region 201 in common, in a case where metal electrodes are disposed on the second n+-type regions 202, differences may exist in the impurity concentration as long as adequately high concentration impurity concentrations can be maintained with which the protecting element 200 itself will not be broken due to a depletion layer, resulting from a voltage due to static electricity, reaching a metal electrode. Also, even if such regions have differences in impurity concentration, differences in size, differences in shape, and several other types of differences, these shall be referred to inclusively as the second n+-type region 202.

Likewise, the first n+-type regions 201 that are connected to the same terminal of the same protected device and are opposed to the second n+-type region 202 in common shall be referred to inclusively as the first n+-type region 201 even if there are such differences in impurity concentration, differences in size, differences in shape, and several other types of differences.

Also, although a part of a GaAs substrate 101 shall be described as an example of the insulating region 203 below, an insulated region, which has been insulated by ion implantation of an impurity into a substrate, may be applied in the same manner.

FIG. 9 shows a cross-sectional model of a device simulation of the voltage—current characteristics of the protecting element 200 by an ISE TCAD (TCAD made by ISE Corp.). The protecting element 200 is formed by forming the first n+-type region 201 and the second n+-type region 202 by performing ion implantation into a 50 µm-thick GaAs semi-insulating substrate at a dose of $5 \times 13$ cm$^{-2}$ and an acceleration voltage of 90 KeV and then annealing. That is, with this structure, all of the area between the first n+-type region 201 and the second n+-type region 202 and the periphery of the two regions are the insulating region 203.

As shown in FIG. 9 with the first n+-type region 201, the width $\alpha 1$ in the direction normal to the opposing surfaces OS of the two regions is approximately 5 µm or less and, preferably, 3 µm. Although the narrower $\alpha 1$ is, the better, a width of 0.1 µm is necessary as a limit at which the device will function as the protecting element 200. Also although in this embodiment, the first n+-type region 201 is placed parallel to and is separated from the second n+-type region 202 by approximately 4 µm, in planar pattern, the tip of the first n+-type region 201 may be made a pointed shape to facilitate discharge. In other words, the pattern may be one with which the distance with respect to the second n+-type region 202 varies. The grounds for setting $\alpha 1$ to 5 µm or less shall be described later.

As shown in FIG. 9, the metal electrodes 204 are connected to the first n+-type region 201 and the second n+-type region 202. The methods illustrated in FIG. 3 and FIG. 4 may be considered as methods of connecting the metal electrodes 204 to the first and second n+-type regions.

The second n+-type region 202 is, for example, a diffusion region disposed below a electrode pad and its width $\alpha 2$ is 51 µm. With each of the first and second n+-type regions, the edge of the metal electrode 204 is away from the edge of two n+-type regions by 1 µm. The perspective depth, which is the device size (for example, the gate width in the case of an FET), is set to 1 µm.

Here, a simulation was performed in which the first n+-type region 201 is made the positive side, the second n+-type region 202 is made the negative side, and a current of 1 A is made to flow, assuming the application of an electrostatic voltage of 700V at 220 pF and 0 Ω.

Figure 10:
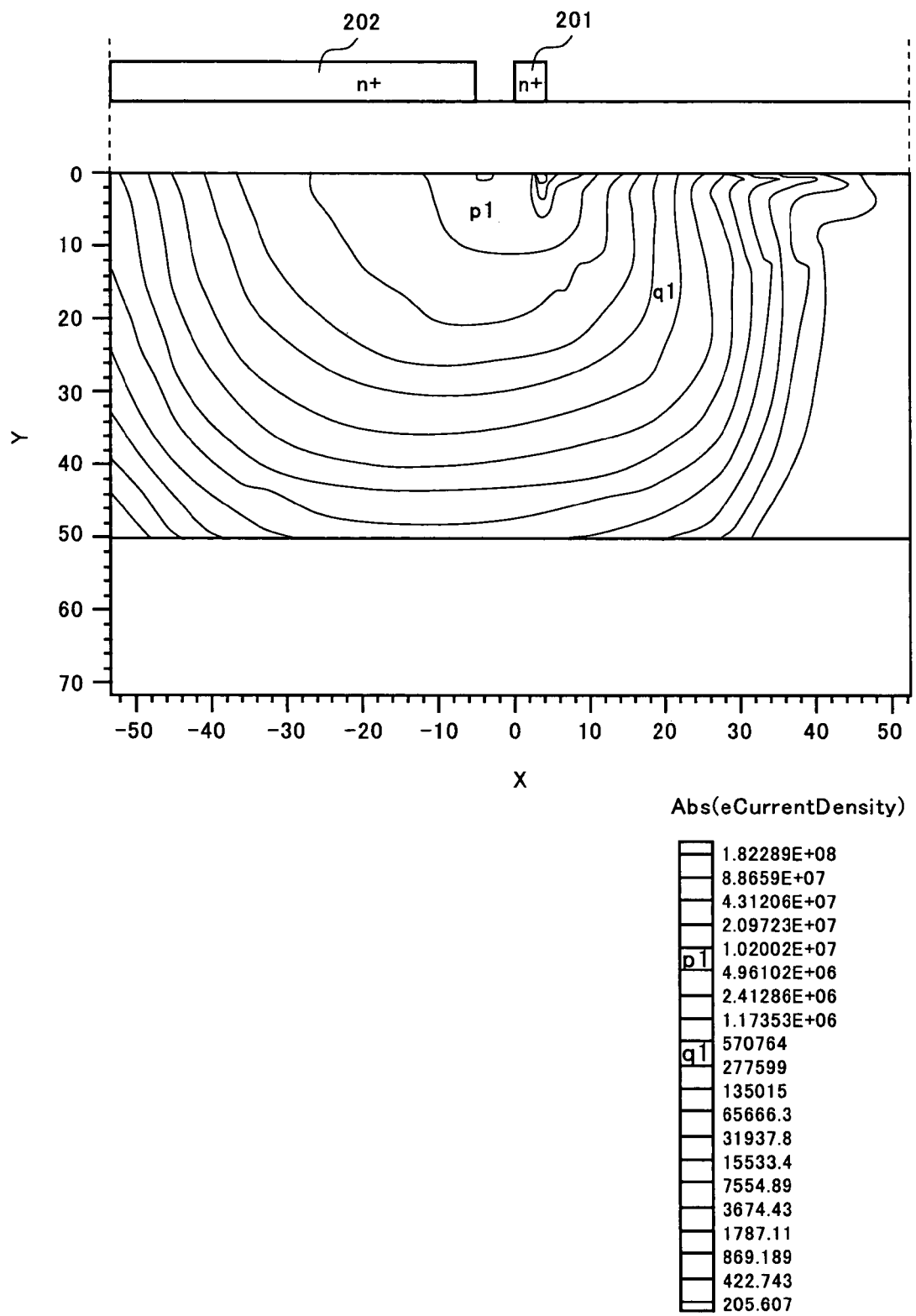
FIG. 10 is an electron current density distribution diagram of the device simulation.
Figure 11:
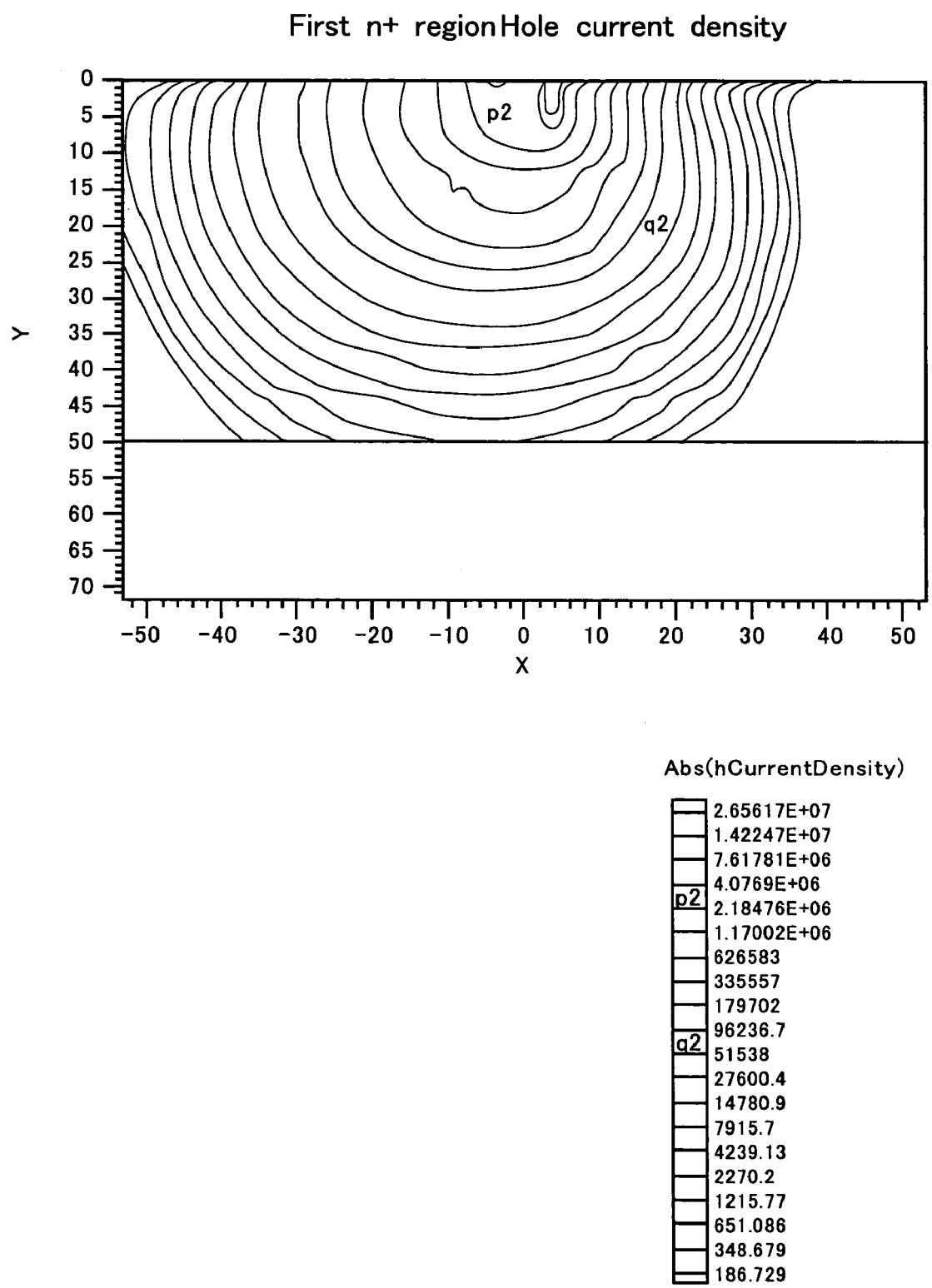
FIG. 11 is a hole current density distribution diagram of the device simulation.
Figure 12:
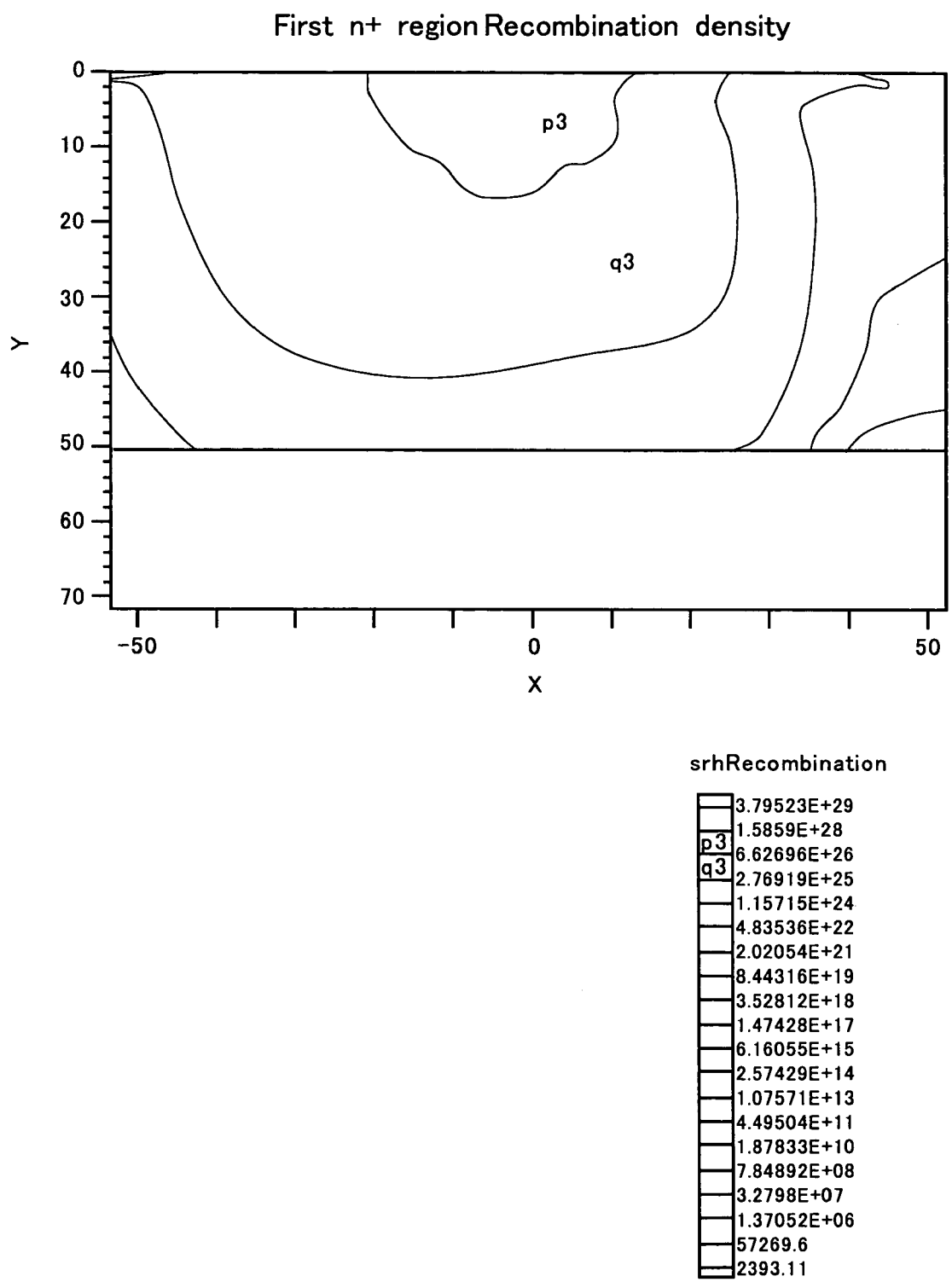
FIG. 12 is a recombination density distribution diagram of the device simulation.

FIG. 10, FIG. 11, and FIG. 12 respectively show the electron current density, hole current density, and recombination density distributions resulting from the simulation. In all cases, the values are indicated in a unit of cm$^{-3}$. In FIG. 10, the cross-sectional model illustrated in FIG. 9 is overlaid at the upper part, the situation is same in FIG. 11 and FIG. 12.

In the electron current density distribution of FIG. 10, the p1 region is the region of the highest density among the regions that span both of the first n+-type region 201 and the second n+-type region 202. Although the total current is the current resulting from summing the electron current and the hole current, since the electron current is by far greater than the hole current, the electron current is taken as representing the current. In this embodiment, the part a of the first and second n+-type regions and the substrate being surrounded by q1 region including q1 region, at which the electron current density becomes approximately 10% that of p1, is defined as the current path of the protecting element 200. The reason of above definition is because a region at which the current density is less than that of q1 is considered as not affecting the operation.

As is clear from FIG. 10, due to the width of a1 being narrow, a large amount of current flows around the side surface at the side opposite opposing surface OS of the first n+-type region 201. It is considered that this wrap-around current will occur in likewise manner when static electricity is applied.

The q1 region at the outer side of the first n+-type region 201 is located at approximately 20 µm on the X-axis at the location furthest from the first n+-type region 201. The X-coordinate of the outer side end of the first n+-type region 201 is 5 µm as shown in FIG. 9, and at parts up to 15 µm at the outer side of the first n+-type region 201, flows approximately 10% or more of the electron current of the region of highest electron current density that spans across both of the first n+-type region 201 and the second n+-type region 202.

The hole current shown in FIG. 11 likewise exhibits a wrap-around at the outer side of the first n+-type region 201. With this hole current density distribution, the hole current density of q2 region near the X-coordinate of 20 µm is approximately 2% of the hole current density of the p2 region of the highest hole current density that spans across both of the first n+-type region 201 and the second n+-type region 202.

The recombination shown in FIG. 12 likewise also exhibits a wrap-around at the outer side of the first n+-type region 201. With the recombination density distribution of FIG. 12, the recombination density of a q3 region near the X-coordinate of 20 µm is approximately 10% of the recombination density of the p3 region of the highest recombination density that spans across both of the first n+-type region 201 and the second n+-type region 202.

Figure 13A:
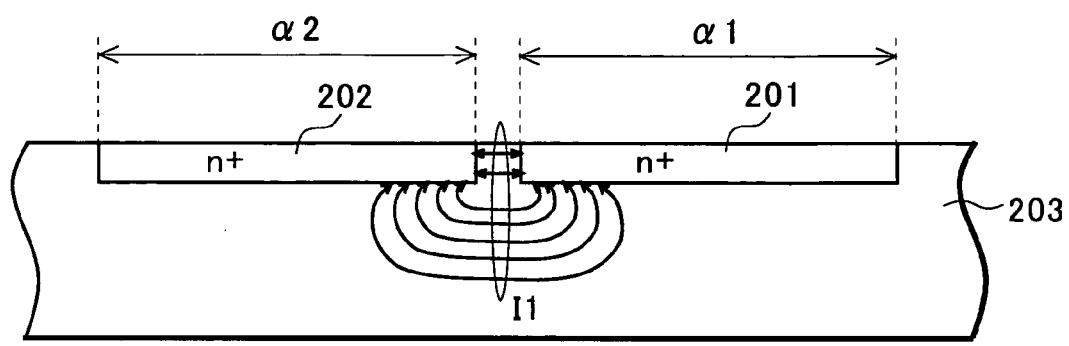
FIG. 13A is a schematic diagram of the current path of an a-structure.
Figure 13B:
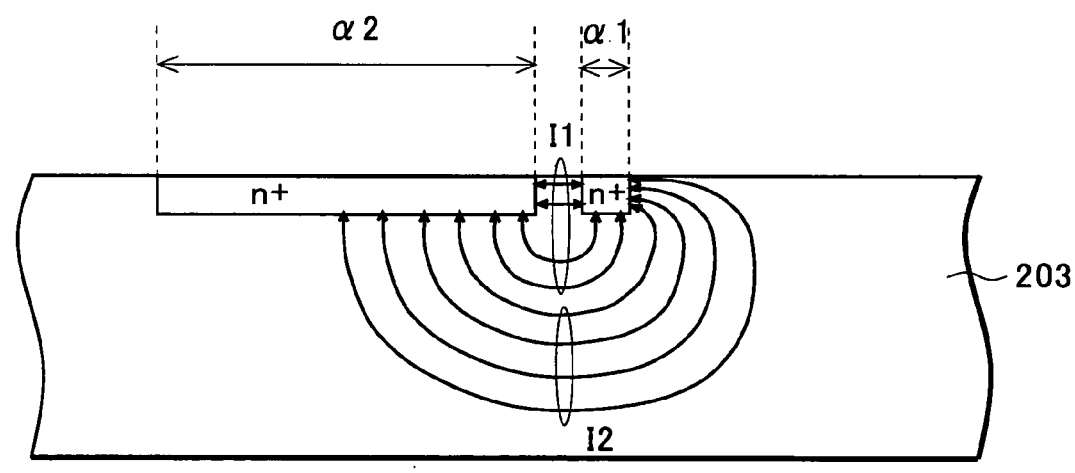

FIGS. 13A and 13B show schematic diagrams of current paths formed in the insulating region 203 at the periphery of the first n+-type region 201 and the second n+-type region 202 based on the above-described distribution diagrams. For the sake of comparison, FIG. 13A shows a schematic diagram when α1 and α2 are wide and have an equal width of approximately 51 µm (this shall be referred to hereinafter as "a-structure"). FIG. 13B illustrates the case where the first n+-type region 201 is provided with an adequately narrow width in comparison to the second n+-type region 202 as shown in FIG. 9 (α1<<α2; this shall be referred to hereinafter as "b-structure").

In the distribution diagrams of FIG. 13A, the densities are distributed symmetrically since α1 and α2 are equal. For the a-structure, the illustration of the distribution diagrams shall be omitted and only the schematic diagram is shown.

When the widths α1 and α2 are wide (51 µm) as in the case of FIG. 13A, a current path (from the p1 region to the vicinity of the q1 region) is formed between the opposing surfaces and near the bottom surface part as indicated by the arrows. The path for the electron current and hole current, which is formed in the space between the opposing surfaces OS of the first n+-type region 201 and the second n+-type region 202 and in the vicinities of the bottom surfaces of the two regions, shall be referred to as a first current path I1, as shown in FIGS. 13A and 113B. That is, the first current path I1 is the only current path of the protecting element 200 of the a-structure.

Meanwhile, when, as shown in FIG. 13B, α1 is narrowed to approximately 5 µm, in addition to the first current path I1, which is formed between opposing surfaces OS and in their vicinities of the bottom surfaces, a path for the electron current and the hole current is formed at regions deeper than those of the first current path I1. This path wraps around the first n+-type region 201, and with this path, the side wall at the outer side of the first n+-type region at the side opposite opposing surface OS is used for flow of the electron current and hole current and the q1 region is formed at a lower location in comparison to the a-structure.

The path for the electron current and the hole current, which is formed at regions deeper than those of the first current path I1 and is formed at an insulating region from the second n+-type region 202 to the side surface at the side opposite opposing surface OS of the first n+-type region 201 as illustrated, shall be referred to as a second current path I2.

As shown in FIG. 13B, since the width of the second n+-type region 202 is 51 µm and thus adequately wide, the current path extends in the horizontal direction under the second n+-type region 202 to the extent much larger than observed with the a-structure.

Meanwhile, since the width α1 is narrow and approximately 5 µm as mentioned above, current flows so as to wrap around the first n+-type region 201 and not only the bottom surface part of the first n+-type region 201 but the side surface at the side opposite from the surface OS also becomes a part of the current path.

Thus as is clear from the above-described drawings, whereas in the case of the a-structure, only the first current path I1 is the current path of the protecting element 200, with the protecting element 200 of the b-structure, the second current path I2 is formed because of the narrow first n+-type region 201 and thus the two current paths of the first current path I1 and the second current path I2 are formed.

With the second current path I2, current flows in and out from the side surface at the outer side of the first n+-type region 201. Also the second current path I2 passes through regions deeper than the regions which the first current path I1 passes through and by reaching the first n+-type region 201 in a detouring (roundabout) manner, provides a long path inside the insulating region 203. Traps (EL2, in the case of GaAs) inside the insulating region 203 can thus be used to increase the opportunity for a conductivity modulation effect.

That is, with the b-structure, the conductivity modulation efficiency is improved in comparison to a case where only first current path I1 is provided and the flow of a larger amount of current is enabled. The current that flows between the first and second n+-type regions is increased, whereby a larger amount of electrostatic current can be made to flow when static electricity is applied and the effect as the protecting element 200 is increased.

The method of improving the conductivity modulation efficiency by intentionally detouring of the current path over a long distance to increase the chance that main carriers will encounter the carriers of the opposite polarity is employed in IGBTs and other conductivity modulation devices and shall be described in detail below.

Generally, what makes an insulating region an insulating region is the existence of traps. As an inherent property, a donor trap has a positive charge, becomes neutral upon capturing an electron, and can become a medium for conductivity modulation. In the case of GaAs, EL2 is the donor trap. Traps also exist in an insulated region formed by impurity implantation.

Figure 14:
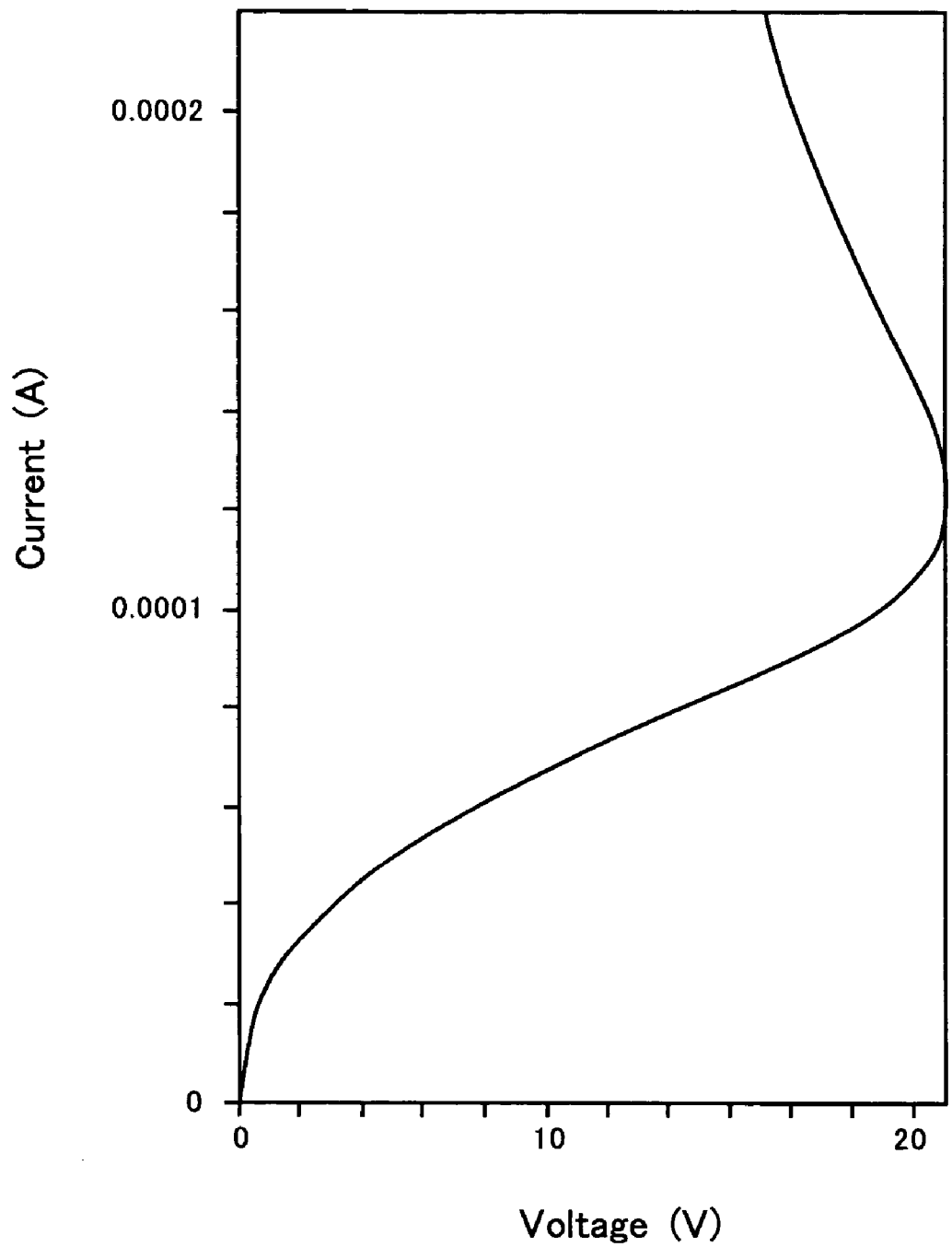
FIG. 14 is a current—voltage diagram of the device simulation.

FIG. 14 shows the results of simulating the voltage—current characteristics at a perspective depth of 1 μm when in the device of FIG. 9, the first n+-type region 201 is made the positive side and the voltage applied between the first n+-type region 201 and the second n+-type region 202 is increased. As illustrated in this figure, the breakdown voltage is 20 to 30V.

The protecting element 200 thus breaks down at 20 to 30V and when a greater voltage is applied, it undergoes bipolar operation and conductivity modulation occurs. Since the protecting element 200 is designed to be broken down when an electrostatic voltage of several hundred V is applied, the conductivity modulation occurs from the initial stage of the operating state of the protecting element 200.

As this conductivity modulation occurs more frequently, the avalanche multiplication following breakdown becomes intense and electron—hole generation and recombination occur more actively, resulting in more current flows.

Thus by forming the second current path I2 in the protecting element 200, the conductivity modulation efficiency at deep regions and in the outward direction of the first n+-type region 201 at the side opposite opposing surface OS can be improved.

Also since the width of the first n+-type region 201 is narrowed to 5 μm or less in order to provide the second current path I2, in the first current path I1, the electrons in the vicinity of the first n+-type region 201 become crowded and repel each other to cause electrons, which are the major carriers, to pass through paths that are deeper and wider in comparison to the a-structure, and thus the first current path I1 itself is more subject to conductivity modulation correspondingly.

Figure 15:
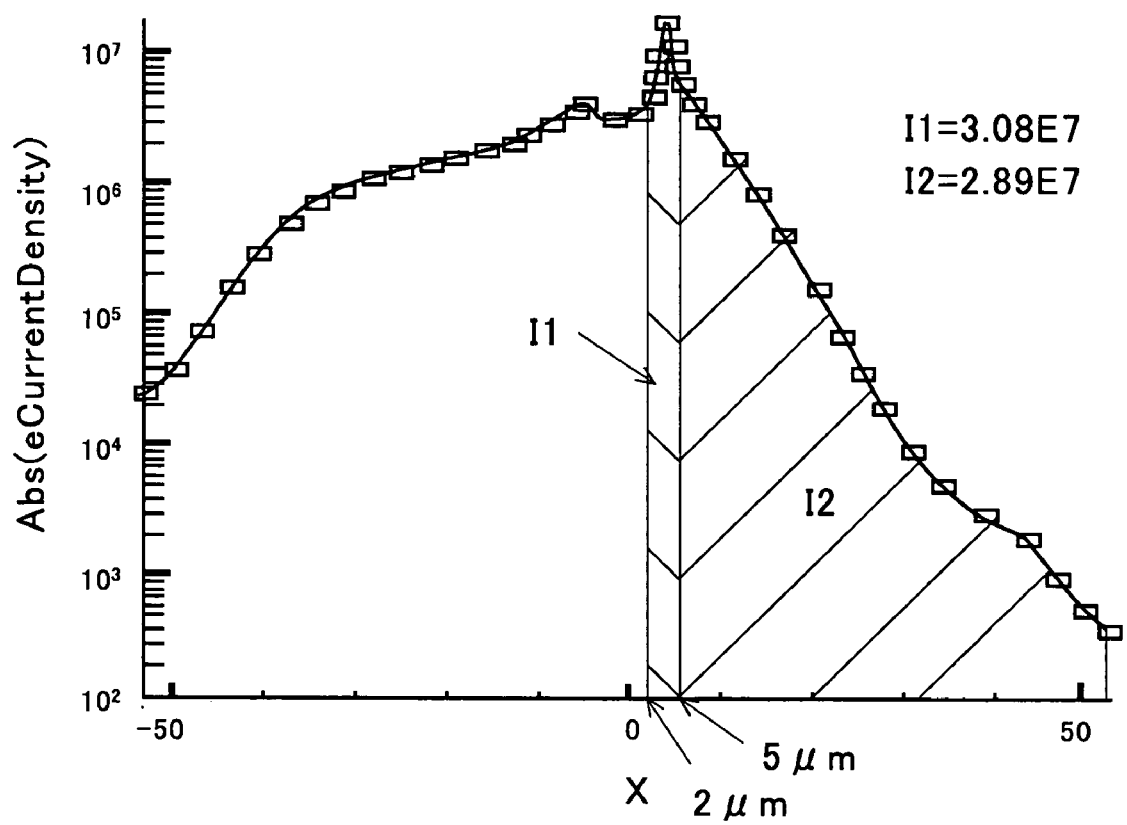
FIG. 15 shows simulated current density as a function of X coordinate.

The graph of FIG. 15 is used to determine the proportion of the current value of the second current path I2 with respect to the total current value of the b-structure. This is a graph of the X-coordinate dependency of the electron current density at a depth of 2 μm from the surface that results from a simulation wherein the first n+-type region 201 is made the positive side and a current of 1 A is made to flow at a perspective depth of 1 μm, assuming the application of an electrostatic voltage of approximately 700V at 220 pF and 0 Ω.

For the electron current density at the depth of 2 μm from the surface, the electron current density immediately below the first n+-type region 201 is integrated along the width in the X-direction of the first n+-type region 201 to determine the value corresponding to the first current path I1, and the electron current density at the outer part with respect to the first n+-type region 201 is integrated along the width in the X-direction of the outer part to determine the value corresponding to the second current path I2, and the proportion of the current value of the second current path I2 is calculated.

As a result, the current value of the second current path I2 was found to be of a proportion of 0.48 (2.89/(3.08+2.89)) with respect to the total current value and thus of a current value of the same level of that of the first current path I1.

Furthermore, as shall be described later, in the case of the b-structure, the first current path I1 itself exhibits a larger current value than the first current path I1 in the case of the a-structure. Thus with the b-structure, since the second current path I2 itself is of the same level as the first current path I1, in total, a far greater amount of current flows in comparison to the a-structure.

Since as a secondary effect, the first current path I1 and the second current path I2 are combined as described above to significantly enlarge the current path in comparison to the a-structure, the temperature inside the crystal becomes lower than that of the a-structure, the mobility of electrons and holes increases correspondingly, and thus a correspondingly larger amount of current can flow.

Since the current value of the protecting element 200 as a whole thus increases, the protection effect increases.

Figures 16A, 16B, 16C:
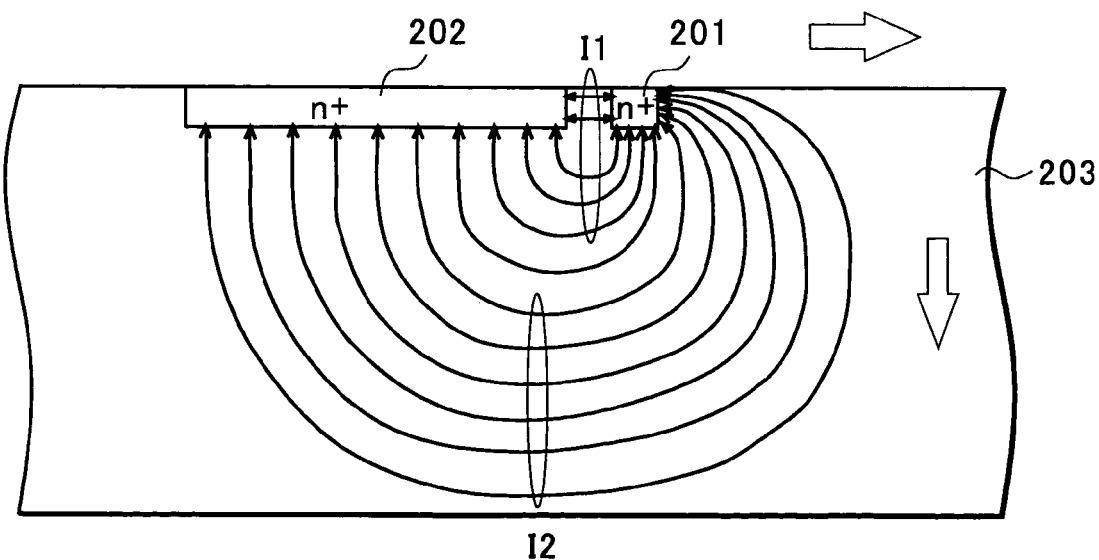
FIGS. 16A and 16B show results of the simulation.
FIG. 16C is a schematic diagram of the current paths of the b-structure.

FIGS. 16A and 16B show a table in which the spreading of the electron current, hole current, and recombination density are compared. Here, simulations were carried out for the a-structure and the b-structure and the resulting values of the same type of density distributions as those shown in FIG. 10 through FIG. 12 are compared under fixed conditions.

In FIG. 16A, "y_2" is the numerical value in unit of μm of the width in the X-direction of a section, obtained in the corresponding density distribution diagram by cutting in the horizontal direction at a depth of 2 μm from the surface, at which the corresponding density becomes $10^5$ cm$^{-3}$.

"x_0" is the numerical value in μm of the depth from the surface at which the corresponding density becomes $10^5$ cm$^{-3}$ in the Y-direction section at X=0 μm in the coordinate system shown in FIG. 9.

"Product" is the value obtained by multiplying the value of y_2 by the value of x_0 and is a value for comparing, in a simulating manner, the area of the figure formed when the points at which the corresponding density becomes $10^5$ cm-3 are traced and joined together. That is, "product" is an index to show the respective spreading of electrons, holes, and recombination.

Also in the table, "a-structure" is the a-structure in which both of the first n+-type region 201 and the second n+-type region 202 have a width of 51 μm (=α1=α2), the second n+-type region 202 is made the positive side, the first n+-type region is made the negative side, and the perspective depth is made 1 μm, and the values for this structure are the calculation results for a case where 0.174 A is made to flow.

The term "b-structure-1" is the b-structure in which the width a 1 of the first n+-type region 201 is set to 3 μm, the width α2 of the second n+-type region 202 is set to 51 μm, the second n+-type region 202 is made the positive side, and the first n+-type region is made the negative side, and the values for this structure are the calculation results for a case where 0.174 A is made to flow at a perspective depth of 1 μm.

The term "b-structure-2" is the b-structure in which the applied polarity is reversed with respect to that of the b-structure-1, that is, with which the width α1 of the first n+-type region 201 is set to 3 μm, the width α2 of the second n+-type region 202 is set to 51 μm, the first n+-type region is made the positive side, and the second n+-type region is made the negative side, and the values for this structure are the calculation results for a case where 0.174 A is made to flow at a perspective depth of 1 μm.

For all three of the abovementioned densities, the product values of both of the b-structure-1 and the b-structure-2 are greater than those of the a-structure.

This indicates that regardless of polarity, that is, regardless of whether the first n+-type region 201 side is positive or the second n+-type region 202 side is positive, the electron current, hole current, and recombination are all distributed over a wider range in the b-structure than in the a-structure and thus that the conductivity modulation efficiency is higher in the b-structure than in the a-structure. Furthermore, since the current flows across a wider range, the temperature drops, resulting in the increased mobility and current flow.

The calculation results for the case where 1A is made to flow through a b-structure-3, which is the b-structure in which the first n+-type region 201 is made the positive side, are shown in FIG. 16B. Whereas a comparison was made for a unified current of 0.174A from the standpoint of calculation ability in the three calculations of FIG. 16A, with actual static electricity the current at a perspective depth of 1 μm is approximately 1 A for conditions of a 700V electrostatic voltage, 220 pF, and 0 Ω. The results are shown here since calculation by simulation for 1 A was possible only for the case where the first n+-type region 201 is made the positive side.

In comparison to the b-structure-2 of FIG. 16A, in the b-structure-3, even though the polarity is the same, the values of the respective products are increased by one order of magnitude or more when the current is increased from 0.174 A to 1 A.

Thus as shown in FIG. 16C, when a higher electrostatic voltage is applied to the protecting element 200 and more electrostatic current flows than the current shown in FIG. 10 and FIG. 13B, which is a schematic diagram of FIG. 10, and the insulating region 203 is adequately large, the region surrounded by the q1 region (region of a current density of approximately 10% or more of the region of highest density) shown in FIG. 16 spreads further downwards and in the outer direction at the side opposite from the surface OS, that is, the second current path I2 spreads. Since the more the second current path I2 spreads, the further the conductivity modulation efficiency is increased, the more current flows, and the further the region surrounded by q1 region spreads downwards, the second current path I2 spreads even further. Since the crystal temperature of the substrate is thus lowered, the carrier mobility can be increased further, more current can be made to flow, and the protection effect can be improved further.

Thus in the b-structure, the higher the electrostatic voltage that is applied, the higher the conductivity modulation efficiency becomes and the more the current path spreads, that is, the conductivity modulation effect can be adjusted automatically.

Also, in the first current path I1, the higher the electrostatic voltage, the deeper the current flows, and thus as with the second current path I2, the conductivity modulation effect can be adjusted automatically.

Thus, by securing an adequate area of the insulating region 203 that can become the second current path I2, a structure is provided with which a protected device can be protected from damage even from static electricity of 2500V at 220 pF and 0 Ω. Moreover, since there is hardly any parasitic capacitance, the high-frequency characteristics of protected device will not be degraded. That is, by connecting the present protecting element 200 with a parasitic capacitance of 20 fF to the device which by itself has an electrostatic breakdown voltage of only approximately 100V, the electrostatic breakdown voltage can be improved by 20 times or more.

Figure 17:
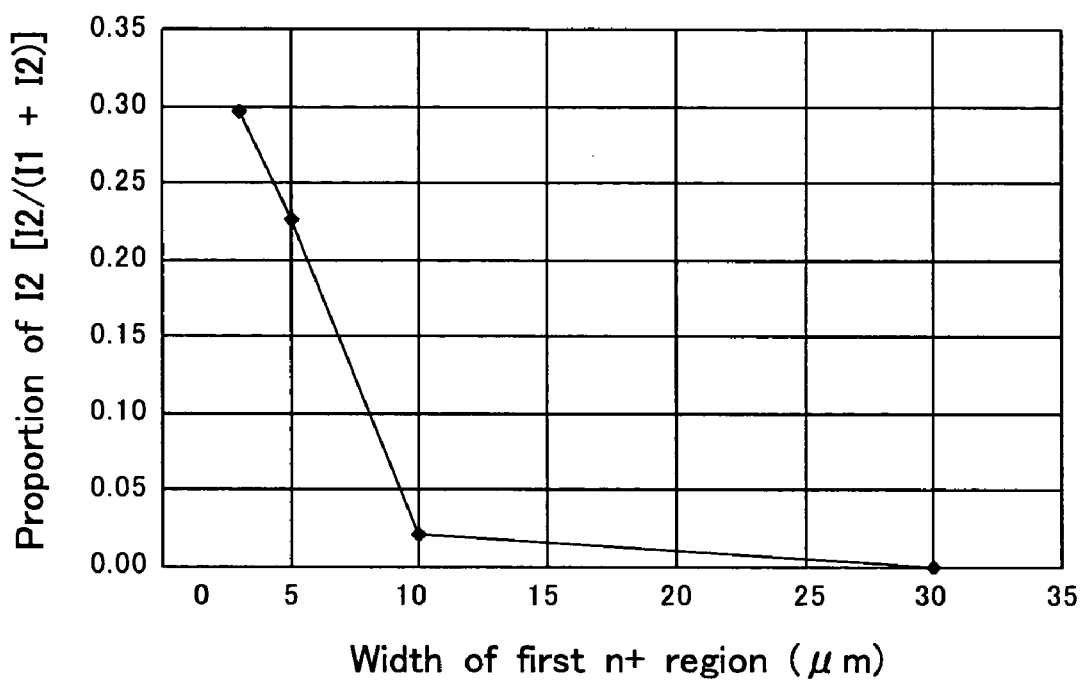
FIG. 17 shows ratios of simulated currents.

The reason why a value of 5 μm or less is preferable for α1 of the b-structure shall now be described using FIG. 17. In FIG. 17, the electron current densities in the b-structure-2 in FIG. 16 are calculated while varying the width α1 of the first n+-type region 201.

When the width α1 of the first n+-type region 201 is made 5 μm or less, the proportion of the second current path I2 increases suddenly. That is, since the current spreads in the horizontal direction and the depth direction, the conductivity modulation efficiency increases correspondingly and the temperature drops, thereby increasing the carrier mobility, and thus the current value increases significantly and the protection effect of the protecting element 200 increases greatly.

Here, whereas the proportion of the second current pass I2 was 0.48 for the case of α1=3 μm shown in FIG. 15, the second current pass I2 proportion for the point corresponding to the first n+-type region width of 3 μm, when the first n+region is positive being same as in FIG. 15, is only 0.3 in the abovementioned FIG. 17 because FIG. 17 shows current values for 0.174 while FIG. 15 shows current values for 1 A, and it can be understood that up until a certain fixed current value, the greater the current, the greater the proportion of the second current path I2. Furthermore, although a comparison was made with 0.174 A due to the limits of the calculation capacity for simulating a large device, as long as a relative comparison is being made, an adequate comparison can be made with this current value.

The width β of the insulating region 203 that should be secured at the outer side of the first n+-type region 201 shall now be described. As mentioned above, with the second current path I2, since the second current path I2 spreads to the insulating region 203 at the side opposite from the surface OS of the first n+-type region 201, the insulating region 203 of an adequate width β is preferably secured at this side.

Figure 18A:
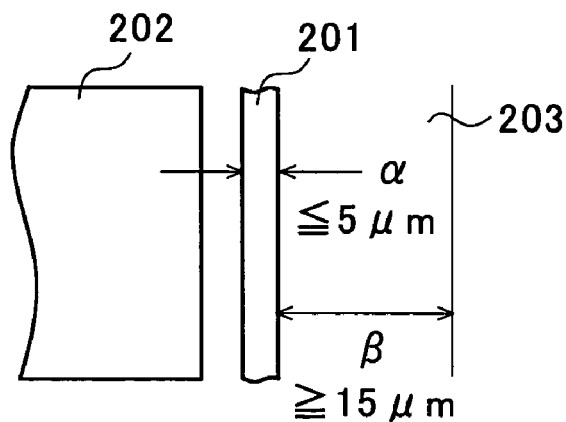
FIG. 18A shows the geometrical factor as part of the modeling.
Figure 18B:
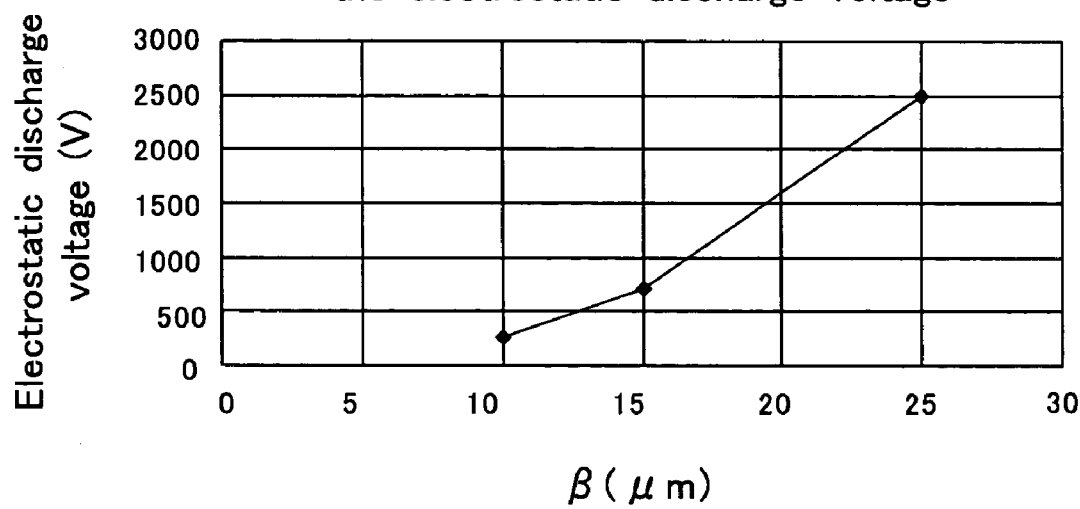
FIG. 18B shows the simulated discharge voltage as a function of a geometric factor.

The relationship between the β of the b-structure and the electrostatic breakdown voltage shall now be described with reference to FIG. 18. As mentioned above, securing an adequate area of the insulating region 203 is to secure an adequate region that can become the second current path I2 and thus provides a high protection effect. That is, a predetermined insulating region width P is secured at the side opposite from the surface OS as shown in the plan view of FIG. 18A. FIG. 18B shows the results of the experiment to measure the electrostatic breakdown voltage upon varying the value of β.

The protected device used for measurements is an element in which a resistor of 10 KΩ is connected in series to the gate of a GaAs MESFET with gate length of 0.5 μm and a gate width of 600 μm. Prior to connection of the protecting element 200, the electrostatic breakdown voltage between the source or drain electrode and the resistor end (gate electrode) is approximately 100V. The electrostatic breakdown voltages are then measured upon connecting the respective ends of the first n+-type region 201 and the second n+-type region 202 of the protecting element 200 of the b-structure in parallel between the source or drain electrode and the resistor end (gate electrode) and varying the value of β. The length of opposing surface OS is 60 μm. The capacitance between the first n+-type region 201 and the second n+-type region 202 is 20 fF.

As shown in FIG. 18B, when β is increased to 25 μm, the electrostatic breakdown voltage is improved to 2500V. The electrostatic breakdown voltage when the β shown in FIG. 18A is 15 μm is 700V. This means that when the electrostatic voltage is increased from 700V to 2500V, the second current path I2 extends by 15 μm or more in the outer direction (β) at the side opposite opposing surface OS of the first n+-type region 201.

When the electrostatic voltage increases, the second current path I2 spreads correspondingly. In other words, although the spreading of the second current path I2 will be restricted if an adequate area of the insulating region 203 is not secured, by securing an adequate area of the insulating region 203, the second current path I2 can be spread adequately.

Thus with the b-structure, by securing a width β of 10 μm or more and preferably 15 μm or more for the insulating region 203 at the outer side of the first n+-type region 201, the second current path I2 can be spread further to increase the conductivity modulation efficiency further.

Although with the a-structure, the electrostatic breakdown voltage could only be increased by two to three times when the protecting element 200 is connected, for the b-structure, it has been confirmed that an electrostatic voltage of 700V is realized if β is 15 μm, and by extending β to 25 μm, the electrostatic voltage can be increased by 2500V, in other words, by 25 times. Thus with the b-structure, by securing a predetermined β, a current of at least approximately 10 times larger than that which can be made to flow through the a-structure protecting element 200 can be made to flow through.

As mentioned above, the current that flows through the first current path I1 and the current that flows through the second current path I2 are nearly equal. Accordingly, the current flow of each of the paths I1 and I2 must be at least 5 times larger than that of the conventional device because the total increase in the current flow of the two paths is at least 10 times.

It is thus preferable for β to be 10 μm or more, and this means that in integrating the protecting element 200 in a chip, other components, wiring, etc., should be positioned upon securing the insulating region 203 with a width β at the outer side of the first n+-type region 201.

Figure 19A:
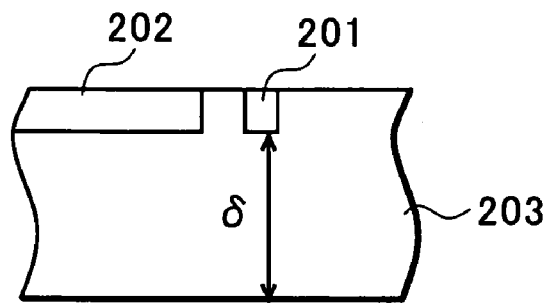
FIG. 19A shows a geometrical factor as part of the modeling.

Likewise as shown in FIG. 19, in order to secure the second current path I2, it is preferable to secure an adequate area of insulating region in the depth direction as well. FIG. 19A is a sectional view, and here, the insulating region 203 of a predetermined depth δ is secured below the first n+-type region 201 and the second n+-type region 202.

Figure 19B:
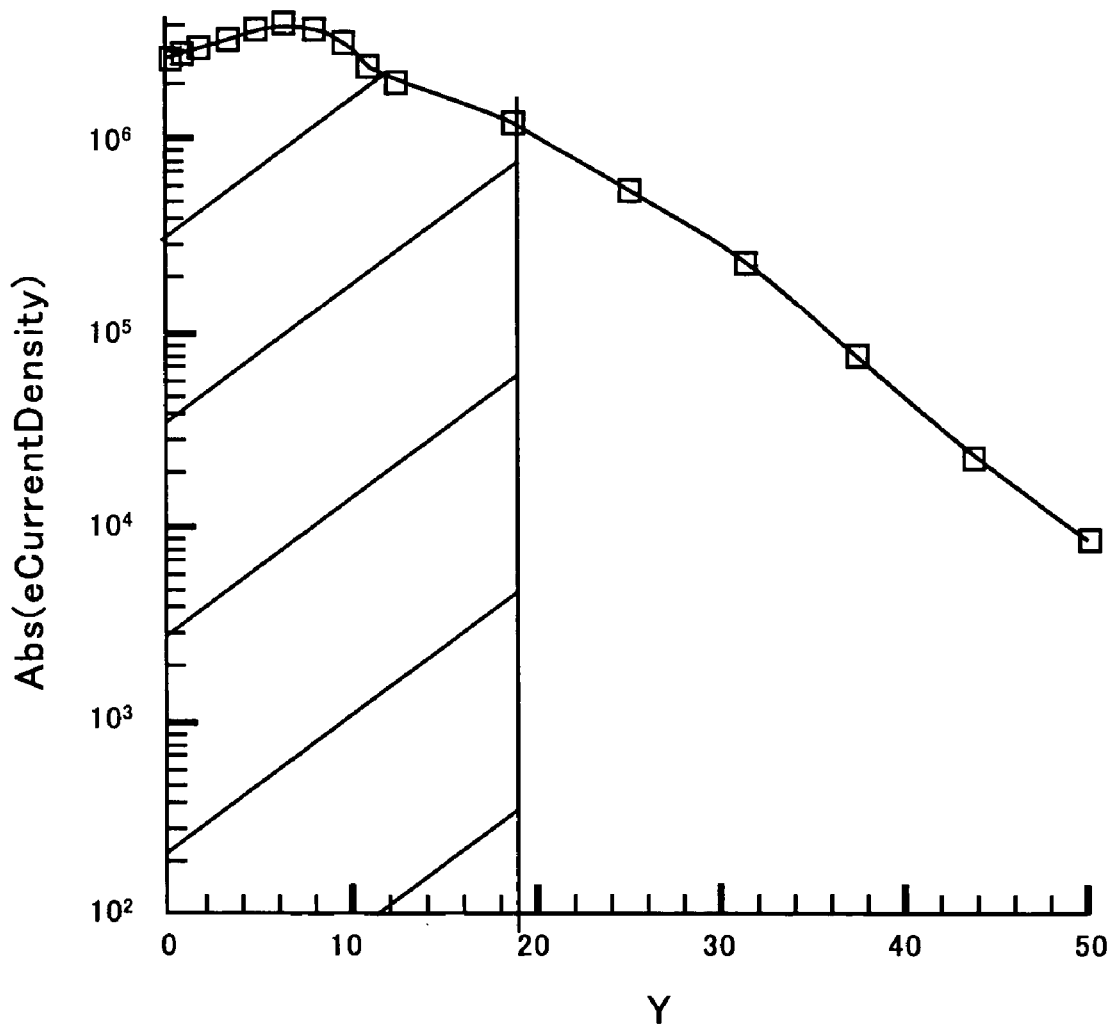
FIG. 19B shows the simulated current density.

FIG. 19B shows a graph of the electron current density along the Y-direction section at coordinate X=0 μm when a simulation is performed in which the first n+-type region 201 is made the positive side and 1 A is made to flow at a perspective depth of 1 μm in assumption of the application of an electrostatic voltage of 700V at 220 pF and 0Ω. When the electron current density is integrated along the depth direction from the surface of this graph, the integral (hatched part) up to a depth (Y) of 19 μm was found to be 90% of the integral up to the total depth of 51 μm. The depth δ of the insulating region 203 is thus preferably 20 μm or more.

Although the sizes (β and δ) of the insulating region 203 that should be secured at the periphery of the protecting element 200 and width (α1) of the first n+-type region 201 were described above, depending on the position on a chip, it may not be possible to secure an adequate β or δ or an adequate length of opposing surfaces OS.

Figure 20A:
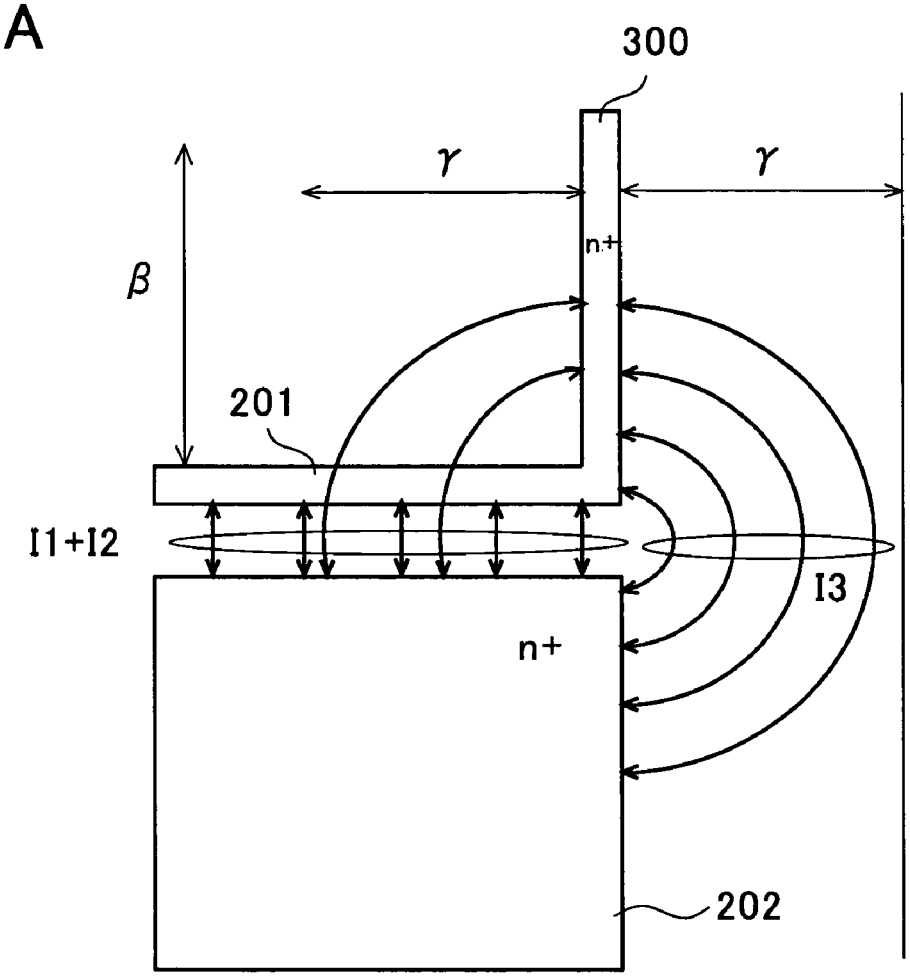
FIG. 20A shows a geometrical factor as part of the modeling.

Thus in such a case, as shown in the plan view of FIG. 20A, an extension part 300 is provided for example by bending the first n+-type region 201 in the direction away from opposing surface OS. A third current path I3, which is to be an electron current and hole current path of high conductivity modulation efficiency, may be formed between the second n+-type region and the extension part 300, which secures a predetermined insulating region γ in the insulating region 203

With the third current path I3, a larger current path can be secured in the insulating region 203 between the extension part 300 and the second n+-type region 202. Although only a planar representation is provided in the figure, since the third current path I3 is also formed in direction perpendicular to the paper surface (direction of the depth of the device), the current in the depth direction increases as well. In the depth direction (direction perpendicular to the paper surface) of opposing surfaces OS, the first current path I1 and the second current path I2 are formed, and the first, second, and third current paths I1 to I3 become the current paths of the protecting elements 200.

Figure 20B:
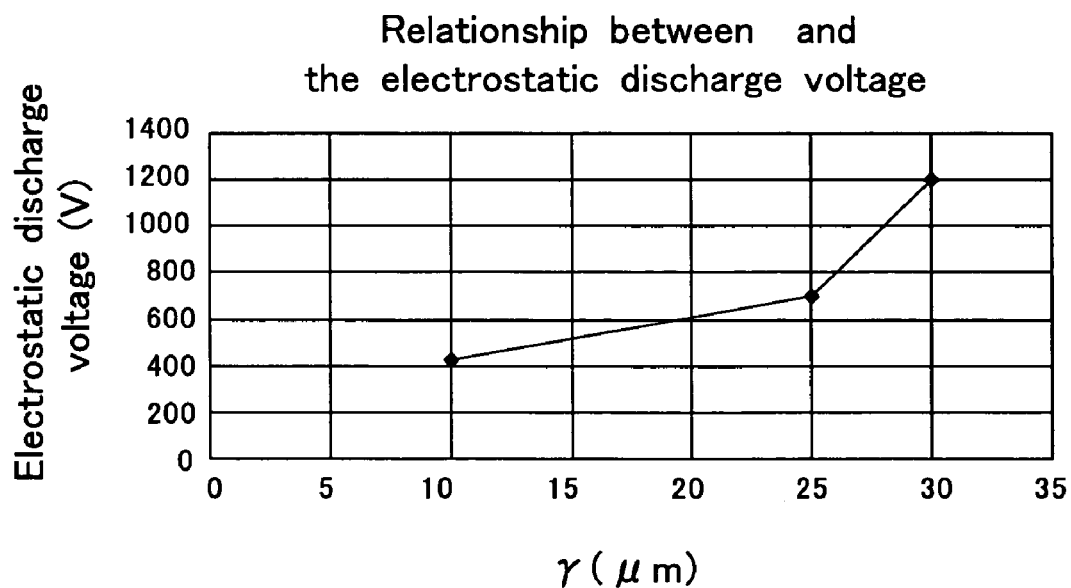
FIG. 20B shows the simulated discharge voltage as a function of the geometrical factor.

In FIG. 20B, measured values are shown for comparison of γ and the electrostatic breakdown voltage. The protected device and the protecting element 200 are connected by the same method as that employed for FIG. 18, with which the electrostatic voltage was measured while varying the value of β.

As shown in FIG. 20B, when γ is increased to 30 μm, the electrostatic breakdown voltage is improved to 1200V. When γ is 25 μm, the electrostatic breakdown voltage is 700V. This means that when the electrostatic breakdown voltage is increased from 700V to 1200V, the third current path I3 extends by 25 μm or more in the insulating region 203 between the extension part 300 and the second n+-type region.

Thus even in the case where the extension part 300 is provided, the third current path I3 can be spread further and the conductivity modulation efficiency can be increased further the higher the electrostatic voltage. In other words, the conductivity modulation effect can be adjusted automatically according to the voltage of the applied static electricity.

In other words, an adequate area of the insulating region 203 is preferably secured at the periphery of the extension part 300 as well and by securing an adequate γ, a space in which the third current path I3 can spread adequately, and can be secured to make more electrostatic current flow in correspondence to the electrostatic voltage. Thus the width γ is preferably 10 μm or more and more preferably 20 μm or more. The effect can be improved by securing γ at the sides of both side surfaces of the extension part 300.

It is optimal to secure γ upon securing β, even if β is inadequate, the effect of the protecting element 200 is improved by securing γ.

Figure 21:
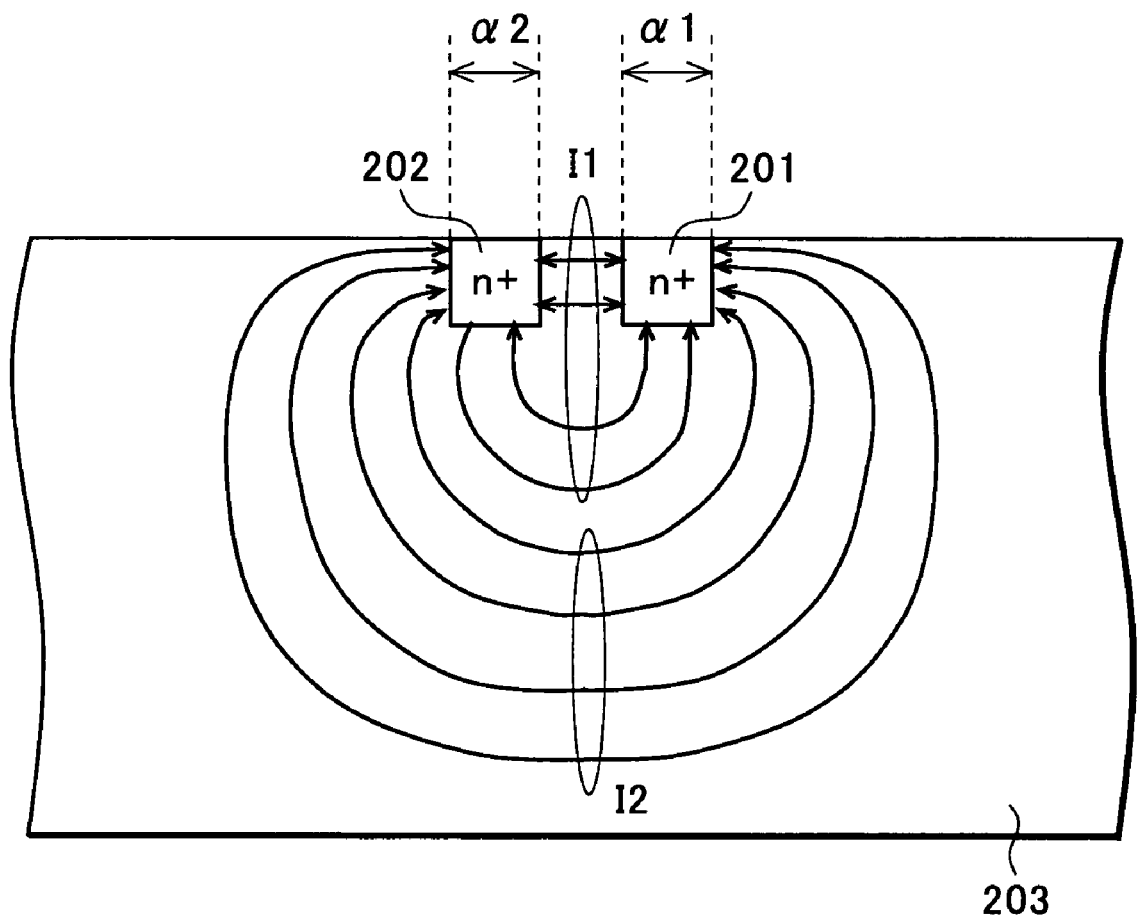
FIG. 21 is a schematic diagram of the current paths of a c-structure.

FIG. 21 shows a schematic diagram of current paths when both of the first n+-type region 201 and the second n+-type region 202 have a width of 5 μm or less (this structure shall be referred to as "c-structure").

The c-structure is a structure in which the width α2 of the second n+-type region 202 of the b-structure is narrowed so as to be equal to α1 of the first n+-type region, and these regions are formed in opposing manner at a distance of approximately 4 μm and have the insulating region 203 at the periphery. The first current path I1 and the second current path I2 are formed with the c-structure as well.

The first current path I1 is formed from the substrate surface to the parts between opposing surfaces OS of the first and second n+-type regions and in the insulating region 203 between the vicinities of the bottom surfaces of the two n+-type regions and is a path for the electron current and the hole current.

The second current path I2 is formed so as to detour through regions that are adequately deeper than the first current path I1 and reach the side surfaces of the two regions at the sides opposite opposing surfaces OS. That is, for both of the first n+-type region 201 and the second n+-type region 202, the side surfaces at the sides opposite from the surfaces OS can be used for the current path and the second current path I2 is formed in regions deeper than the first current path I1.

Figure 22:
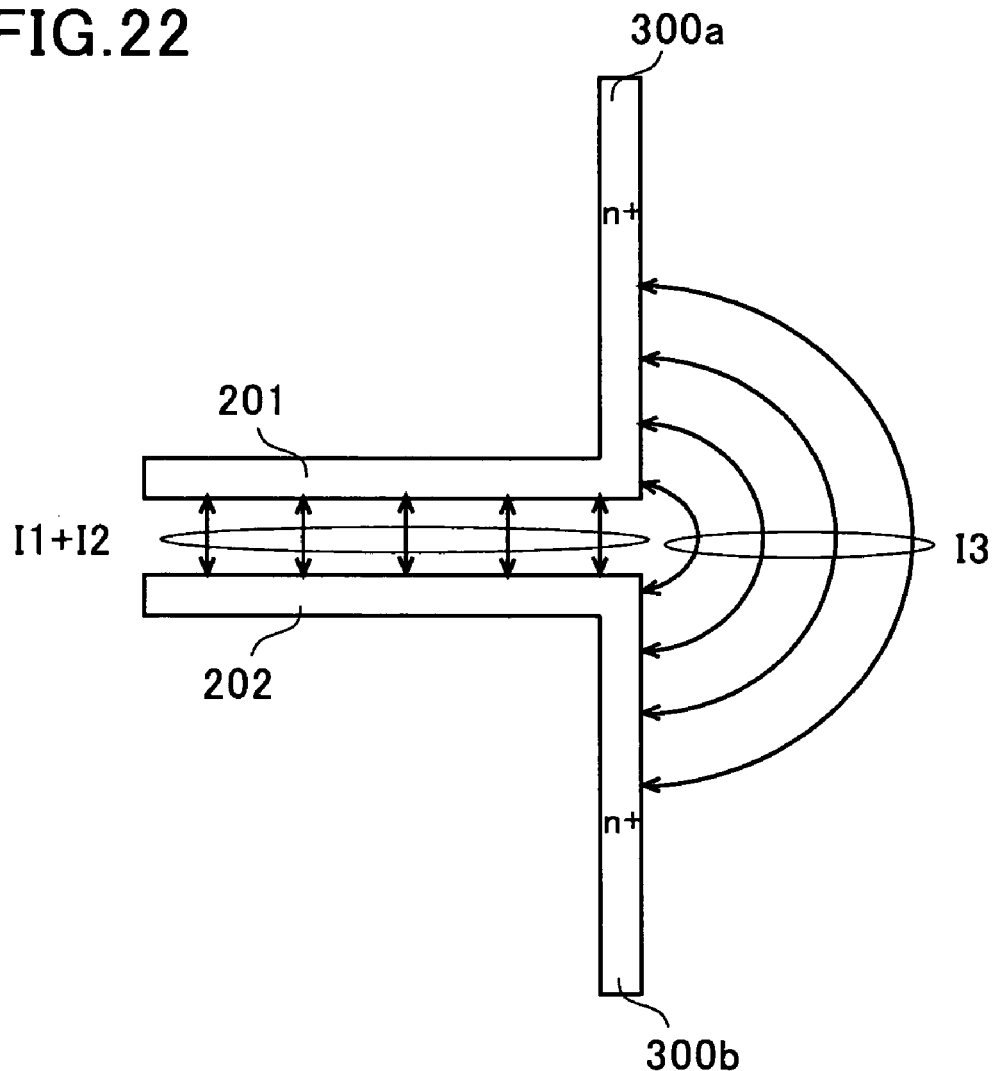
FIG. 22 is a schematic plan view for a different modeling.
Figure 23:
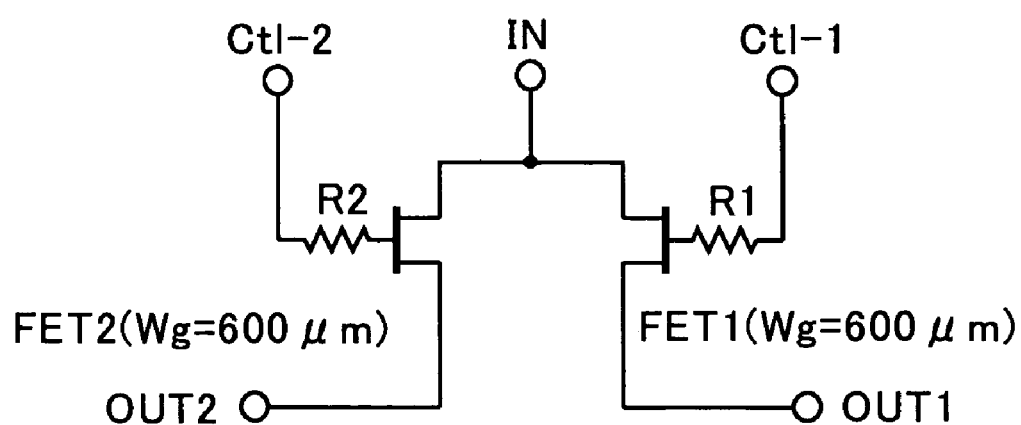
FIG. 23 is a circuit diagram of a conventional semiconductor device.

Furthermore as shown in FIG. 22, the first n+-type region 201 may be provided with an extension part 300a to form the third current path I3 that is to be a path for the electron current and the hole current that increases conductivity modulation in the insulating region between the extension part 300a and the second n+-type region 202.

Likewise, the second n+-type region 202 may be provided with an extension part 300b to form the third current path I3 that is to be a path for the electron current and the hole current that increases conductivity modulation in the insulating region between the extension part 300b and the first n+-type region 201.

Just one of either of the extension parts 300a and 300b may be provided or both of the n+-type regions may be provided with extension parts. Although in the drawing, these are provided by bending in the direction away from opposing surface OS, these may be provided by extending instead of bending. Since the third current path I3 is thereby formed as shown in FIG. 22, the current value increases and the protection effect increases.

As values of β, γ, and δ, the abovementioned values are favorable, and although values less than the abovementioned values will still enable the securing of current paths that are greater in comparison to those of the a-structure, it is preferable to provide a pattern that can secure the respective values described above as much as possible.

That is, an adequate space (β, γ) is preferably secured in the insulating region 203 at the periphery of the first n+-type region 201 (in the case of the c-structure, of the second n+-type region 202 as well) that forms the protecting element 200 so as not to obstruct the second current path I2 or the third current path I3, and protected device to which the protecting element 200 is connected and other components and wiring, etc., are preferably placed at the outer side of the first n+-type region 201 at a distance of approximately 10 μm or more. Also, since insufficient areas of chip end parts can also obstruct a current path, when the first n+-type region 201 is positioned at a chip end part, approximately 10 μm or more is preferably secured as the distance to the chip end as well.

Hereinafter, the patterns of the protecting element 200 will be described with reference to FIG. 6. In the switching circuit device of FIG. 6, the protecting element 200 is connected to the common input terminal pad I. At the periphery of the respective electrode pads 70, the pad peripheral n+-type region 150 to form a Schottky junction with the pad is arranged.

Namely, in FIG. 6, by arranging the resistors R1-1 and R2-1 adjacent the common input terminal pads I, respectively, the separation distance between the n+-type regions of the resistor R1-1 and R2-1 and the pad peripheral n+-type region 150 is about 4 μm, and the insulating region 203 is arranged in the surroundings, thus the protecting element 200 is completed. A part of the resistors R1-1 and R2-1 is the first n+-type region 201, and a part of the pad peripheral n+-type regions 150 at the periphery of the common input terminal pad I is the second n+-type region 202. Namely, this means that the protecting element 200 is connected between the control terminal and common input terminal of a switching circuit device.

In this pattern, the width of the resistors R1-1 and R2-1 is α1 and is designed to be 5 μm or less. Moreover, in the pattern of FIG. 6, the second n+-type region 202 is not provided under the whole surface of the electrode pad but is only in the peripheral part. However, as described above, since the side surface of the second region 202 opposite from the surface OS is not utilized as the second current path I2, the b-structure is provided in this case.

In this pattern as well, the width β of the insulating region 203 on the outer side of the resistors R1-1 and R2-1 (the first n+-type region 201) is 10 μm or more, and other components are arranged. In this pattern, the end of β is of the pad peripheral n+-type regions 150 of the control terminal pad C1 and C2, and the distance from the resistors R1-1 and R2-1 is 10 μm or more.

There may also be cases where 10 μm or more cannot be secured as β, and the current flowing through the second current path I2 is lessened correspondingly. As a countermeasure for this situation, an extension part may, for example, be provided at the first n+-type region 201 to form the third current path I3 in the insulating region 203 between the extension part and the second n+-type region 202.

With the pattern of FIG. 6, by providing the extension part 300a by bending the resistor R1-1 or R2-1 and securing 10 μm or more as the width (γ) of the insulating region 203 between the extension part 300a and the edge of the substrate, this peripheral portion of the insulating region 203 becomes the current path I3.

That is, even if an adequate the second current path I2 cannot be secured, the third current path can be formed to adequately protect the Schottky junction between the control terminal and the common input terminal of the switching circuit device from static electricity.

The same applies to the protecting elements 200 arranged with the output terminal pad O1 and the resistor R1-2 and with the output terminal pad O2 and the resistor R2-2.

Thus the protecting element 200 of this embodiment is should be disposed between two terminals of the protected device, upon making the width of at least one of the high concentration impurity regions of the first n+-type region 201 and the second n+-type region 5 μm or less, and upon securing an adequate area of insulating region (β, γ) at the periphery.

Although the insulating region 203 made of GaAs is used in the embodiments above, the insulating region 203 may be a region, which has been made insulating by the ion implantation and diffusion of an impurity into a substrate, and in such a case, silicon substrate can be also employed.

What is claimed is:

1. A semiconductor device comprising:
a substrate;
a plurality of electrodes provided for an operating region formed in the substrate;
a plurality of electrode pads formed on the substrate and each connected to a corresponding electrode of the operating region;
a plurality of wiring connections between one of the electrodes and a corresponding electrode pad; and
a protecting element formed along each of the wiring connections and comprising a first high concentration impurity region formed in the substrate, a second high concentration impurity region formed in the substrate and an insulating region between the first and second high concentration impurity regions, the insulating region being part of the substrate and the protecting element being connected between two electrodes of the plurality of electrodes.

2. The semiconductor device of claim 1, wherein the protecting element is configured to improve an electrostatic breakdown voltage of the semiconductor device by at least 20 volts over a corresponding semiconductor device without the protecting element.

3. The semiconductor device of claim 1, wherein each of the protecting elements is disposed adjacent one of the electrode pads.

4. The semiconductor device of claim 1, wherein one of the first and second high concentration impurity regions is connected to part of one of the electrode pads or part of a metal wiring connection connected to one of the electrodes.

5. The semiconductor device of claim 1, wherein one of the first and second high concentration impurity regions is connected to one of the wiring connections.

6. The semiconductor device of claim 1, further comprising a third high concentration impurity region disposed at a periphery of one of the electrode pads, wherein one of the first and second high concentration impurity regions comprises part of the third high concentration impurity region.

7. The semiconductor device of claim 1, wherein one of the wiring connections comprises a resistor.

8. The semiconductor device of claim 1, wherein one of the first and second high concentration impurity regions comprises part of one of the wiring connections.

* * * * *